(12) United States Patent
Ikeda et al.

(10) Patent No.: US 6,844,659 B2
(45) Date of Patent: Jan. 18, 2005

(54) WIRING BOARD AND METHOD OF MANUFACTURING SAME

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 147 days.

(21) Appl. No.: 10/118,744

(22) Filed: Apr. 9, 2002

(65) Prior Publication Data
US 2002/0149101 A1 Oct. 17, 2002

(30) Foreign Application Priority Data
Apr. 11, 2001 (JP) ........................................ 2001-113141

(51) Int. Cl.⁷ .......................... H05K 1/16; H01L 41/083
(52) U.S. Cl. ........................................ 310/321; 257/703
(58) Field of Search .......................... 310/321; 257/703, 257/668, 758; 29/620

(56) References Cited

U.S. PATENT DOCUMENTS

| | | | |
|---|---|---|---|
| 2,497,665 A | | 2/1950 | Gravley |
| 4,081,315 A | * | 3/1978 | Templin ........................ 216/16 |
| 4,290,041 A | | 9/1981 | Utsumi et al. ................. 338/21 |
| 4,340,840 A | * | 7/1982 | Aboelfotoh et al. .......... 315/58 |
| 4,612,440 A | | 9/1986 | Brunnée et al. .............. 250/281 |
| 4,677,250 A | * | 6/1987 | Barnett et al. ............... 136/258 |
| 4,685,203 A | * | 8/1987 | Takada et al. ................ 29/620 |
| 4,805,057 A | | 2/1989 | Ogawa et al. ............... 360/109 |
| 4,963,389 A | * | 10/1990 | Takada et al. ................ 427/98 |
| 5,049,775 A | | 9/1991 | Smits .......................... 310/328 |
| 5,166,571 A | | 11/1992 | Konno et al. ................ 310/333 |
| 5,175,465 A | | 12/1992 | Um et al. .................... 310/328 |
| 5,510,594 A | * | 4/1996 | Mori et al. ............. 219/121.69 |
| 5,590,017 A | * | 12/1996 | Kelso ....................... 361/321.4 |
| 5,691,594 A | | 11/1997 | Takeuchi et al. ............ 310/330 |
| 5,745,319 A | | 4/1998 | Takekado et al. ........ 360/78.05 |
| 5,828,157 A | | 10/1998 | Miki et al. .................. 310/328 |
| 5,912,524 A | | 6/1999 | Ohnishi et al. ............. 310/321 |

(List continued on next page.)

FOREIGN PATENT DOCUMENTS

| | | |
|---|---|---|
| EP | 1 017 116 A2 | 7/2000 |
| EP | 1 089 351 A2 | 4/2001 |
| EP | 1 089 352 A2 | 4/2001 |
| EP | 1 089 356 A2 | 4/2001 |
| EP | 1 089 358 A2 | 4/2001 |
| JP | 63-64640 | 3/1988 |
| JP | 10-136665 | 5/1998 |
| WO | 01/26166 A1 | 4/2001 |
| WO | 01/26169 A1 | 4/2001 |

OTHER PUBLICATIONS

U.S. Appl. No. 10/046,331, filed Jan. 14, 2002, Ikeda et al.
Yoshikazu Soeno, et al., "Piezoelectric Piggy–Back Microactuator for Hard Disk Drive," IEEE Transactions on Magnetics, vol. 35, No. 2, Mar. 1999, pp 983–987.
S. Koganezawa, et al., "Dual–Stage Actuator System for Magnetic Disk Drives Using a Shear Mode Piezoelectric Microactuator," IEEE Transactions on Magnetics, vol. 35, No. 2, Mar. 1999, pp 998–992.
U.S. Appl. No. 09/671,669, filed Sep. 27, 2000, Takeuchi et al.
U.S. Appl. No. 10/067,958, filed Feb. 5, 2002, Takeuchi et al.

*Primary Examiner*—Michael C. Zarroli
(74) *Attorney, Agent, or Firm*—Burr & Brown

(57) ABSTRACT

A first cermet layer, constituting a first wiring pattern, and a second cermet layer, constituting an insulating layer filling gaps in the first wiring pattern, are formed on a ceramic substrate. Thereafter, the first and second cermet layers are fired to simultaneously produce the first wiring pattern and the insulating layer. Next, a PZT paste constituting a piezoelectric/electrostrictive layer is formed and thereafter fired to produce the piezoelectric/electrostrictive layer. Thereafter, a third cermet layer, constituting a second wiring pattern, is formed and fired to produce the second wiring pattern, thereby fabricating a wiring board.

23 Claims, 19 Drawing Sheets

U.S. PATENT DOCUMENTS

| | | | |
|---|---|---|---|
| 6,018,212 A | 1/2000 | Kikeuchi et al. | 310/321 |
| 6,046,531 A | 4/2000 | Kikuchi et al. | 310/367 |
| 6,049,158 A | 4/2000 | Takeuchi et al. | 310/328 |
| 6,107,727 A | 8/2000 | Kaida et al. | 310/366 |
| 6,109,104 A | 8/2000 | Fukuda et al. | 72/504.13 |
| 6,140,739 A | 10/2000 | Arai et al. | 310/321 |
| 6,186,003 B1 | 2/2001 | Kikuchi et al. | 73/504.12 |
| 6,246,552 B1 | 6/2001 | Soeno et al. | 360/294.4 |
| 6,274,966 B1 | 8/2001 | Kohno et al. | 310/328 |
| 6,323,582 B1 | 11/2001 | Takeuchi et al. | 310/330 |
| 6,329,740 B1 | 12/2001 | Hirota et al. | 310/328 |
| 6,333,681 B1 | 12/2001 | Takeuchi et al. | 331/314 |
| 6,335,586 B1 | 1/2002 | Takeuchi et al. | 310/330 |
| 6,342,751 B1 | 1/2002 | Takeuchi et al. | 310/330 |
| 6,351,056 B1 | 2/2002 | Takeuchi et al. | 310/328 |
| 6,383,926 B2 * | 5/2002 | Powell | 438/678 |
| 6,396,193 B1 | 5/2002 | Takeuchi et al. | 310/321 |
| 6,404,109 B1 | 6/2002 | Takeuchi et al. | 310/348 |
| 6,452,309 B1 | 9/2002 | Takeuchi et al. | 310/331 |
| 6,472,799 B2 | 10/2002 | Takeuchi et al. | 310/348 |
| 6,476,336 B1 * | 11/2002 | Takeuchi et al. | 200/181 |
| 6,476,539 B1 | 11/2002 | Takeuchi et al. | 310/330 |
| 6,498,419 B1 | 12/2002 | Takeuchi et al. | 310/321 |
| 6,525,448 B1 | 2/2003 | Takeuchi et al. | 310/328 |
| 6,531,805 B2 | 3/2003 | Ikeda et al. | 310/331 |
| 6,534,899 B1 | 3/2003 | Takeuchi et al. | 310/323.7 |
| 6,538,362 B1 | 3/2003 | Takeuchi et al. | 310/324 |
| 6,570,297 B1 | 5/2003 | Takeuchi et al. | 310/328 |
| 6,643,902 B2 | 11/2003 | Takeuchi et al. | 29/25.35 |
| 6,657,364 B1 | 12/2003 | Takeuchi et al. | 310/328 |
| 6,715,192 B2 | 4/2004 | Takeuchi et al. | 29/25.35 |
| 6,751,832 B2 | 6/2004 | Hirota et al. | 29/25.35 |
| 2002/0010990 A1 | 1/2002 | Takeuchi et al. | |

* cited by examiner

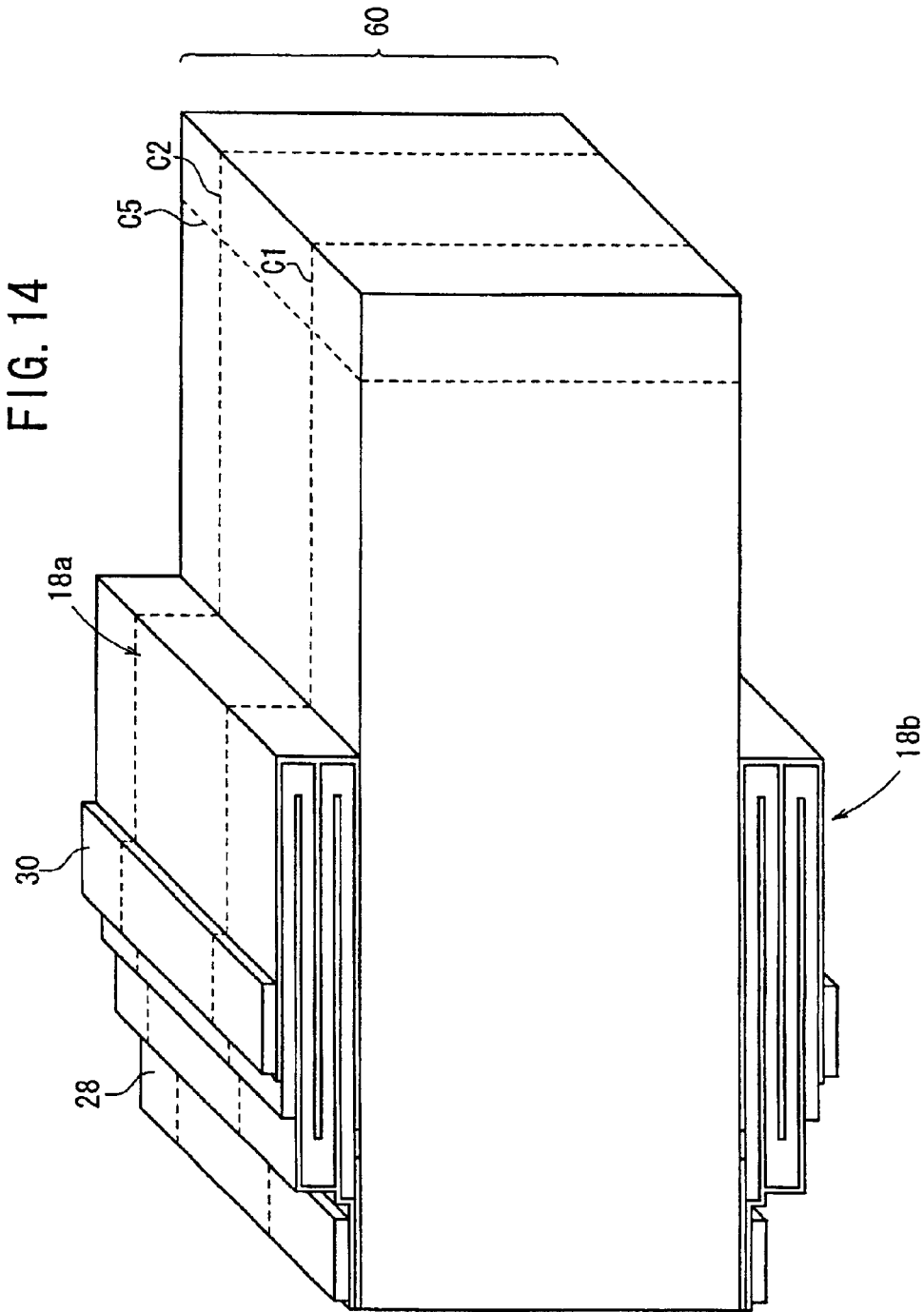

WIRING BOARD AND METHOD OF MANUFACTURING SAME

This application claims the benefit of Japanese Application 2001-113,141, filed Apr. 11, 2001, the entirety of which is incorporated herein by reference.

FIELD OF THE INVENTION

The present invention relates to a wiring board and a method of manufacturing such a wiring board, and more particularly to a wiring board having wiring patterns of electrode layers on a ceramic substrate and a method of manufacturing such a wiring board.

BACKGROUND OF THE INVENTION

There have recently been proposed various wiring boards including printed-circuit boards having wiring patterns formed on substrates.

Wiring boards for use as actuator or sensor devices having piezoelectric/electrostrictive layers have a wiring pattern comprising an electrode layer formed by printing, for example, on a ceramic substrate and another wiring pattern comprising a piezoelectric/electrostrictive layer and an electrode layer on the other wiring pattern.

Wiring boards having piezoelectric/electrostrictive layers can be used as actuator or sensor devices by supplying an electric signal to the wiring pattern and applying an electric field to the piezoelectric/electrostrictive layer. Specifically, the actuator device operates to displace the piezoelectric/electrostrictive layer by applying an electric field to the piezoelectric/elctrostrictive layer, and the sensor device operates to extract an electric signal generated in response to a pressure applied to the piezoelectric/electrostrictive layer, through the wiring pattern.

In the wiring boards, since the bonding strength between the wiring pattern and the ceramic substrate or between the wiring pattern and the piezoelectric/electrostrictive layer is weak, the wiring pattern may peel off while the wiring board is being machined, e.g., cut off or polished, or being cleaned, e.g., ultrasonically, at the boundary between the ceramic substrate and the wiring pattern or at the boundary between the wiring pattern and the piezoelectric/electrostrictive layer.

Depending on the planar configuration of the wiring pattern, the wiring board may contain a region where no electrode layer is formed on the ceramic substrate. In such a region, the ceramic substrate and the piezoelectric/electrostrictive layer are disposed in confronting relation to each other, and a void will be produced after the wiring board is fired. The reason for this problem is that the material of the ceramic substrate and the material of the piezoelectric/electrostrictive layer are hardly joined to each other.

The void makes the piezoelectric/electrostrictive layer float partly off the ceramic substrate. Since the floating portion of the piezoelectric/electrostrictive layer is not positionally secure with respect to the ceramic substrate, it can freely move under applied external forces, and hence is liable to peel off.

To prevent the piezoelectric/electrostrictive layer from peeling off, when the wiring board is cut off, for example, any load applied to the piezoelectric/electrostrictive layer, e.g., a force imposed on the piezoelectric/electrostrictive layer when the wiring board is severed, should be small. It is thus necessary to limit the cutting process to small load conditions, and the limited cutting process takes a long period of time and results in a low throughput.

When the wiring board is cleaned, any load applied to the piezoelectric/electrostrictive layer, e.g., a force imposed on the piezoelectric/electrostrictive layer when the wiring board is cleaned, should also be small. Therefore, in order to remove smears from the wiring board, a long period of time is required to clean the wiring board, and the number of man hours involved in the cleaning process is increased.

When a piezoelectric/electrostrictive layer is peeled off, the following drawbacks are caused:

(1) The functions of the wiring board are lowered;

(2) If a wiring pattern is peeled off a piezoelectric/electrostrictive layer, then the electrostatic capacitance is reduced, resulting in a reduced amount of strain in the piezoelectric/electrostrictive layer. Therefore, the displacement of the piezoelectric/electrostrictive layer is reduced;

(3) If a wiring pattern is peeled off a ceramic substrate, then the strain generated in the piezoelectric/electrostrictive layer is less transmitted to the ceramic substrate. Therefore, the displacement of the piezoelectric/electrostrictive layer is reduced; and (4) The overall mechanical strength of the wiring board is reduced, resulting in a reduction in the resonant frequency of the wiring board when the board is used as an actuator.

SUMMARY OF THE INVENTION

It is therefore an object of the present invention to provide a wiring board whose laminated body layers are prevented from peeling, which can be manufactured in a reduced number of man hours for an increased throughput, and whose functions are prevented from being reduced, and a method of manufacturing such a wiring board.

According to one aspect of the present invention, a wiring board is provided, including a ceramic substrate and a wiring pattern disposed as an electrode layer on the ceramic substrate, the wiring pattern having gaps filled with an insulating layer made of a cermet.

Since the gaps in the wiring pattern are filled with the insulating layer made of cermet, another layer which may be formed on the wiring pattern is held against the wiring pattern and the insulating layer in the gaps, and hence does not tend to peel off.

If the insulating layer comprises a cermet layer containing a material of the electrode layer, and if the layer on the wiring pattern is made of a material that easily adheres to the material of the electrode layer, then the layer on the wiring pattern is firmly bonded to the wiring pattern and the insulating layer, and is more resistant to peel off.

With the above arrangement, a laminated assembly of the wiring board is prevented from peeling off, the number of man hours involved in manufacturing the wiring board is reduced, and the throughput of the wiring board is increased. In addition, the functions of the wiring board are prevented from being lowered.

The wiring board may further include a piezoelectric/electrostrictive layer disposed on the wiring pattern. The piezoelectric/electrostrictive layer thus disposed on the wiring pattern is also prevented from peeling off, allowing an actuator or sensor device using a piezoelectric/electrostrictive layer to perform its functions fully.

According to another aspect of the present invention, a wiring board is provided, including a ceramic substrate, a wiring pattern disposed as an electrode layer on the ceramic substrate, and a piezoelectric/electrostrictive layer disposed on the wiring pattern, the wiring pattern having gaps filled with an insulating layer made of a cermet.

Since the layer on the wiring pattern is the piezoelectric/electrostrictive layer which is likely to adhere to the material of the electrode layer, the wiring pattern and the piezoelectric/electrostrictive layer are hardly peeled off each other. If the insulating layer is a cermet layer containing the material of the piezoelectric/electrostrictive layer, then because the insulating layer and the piezoelectric/electrostrictive layer disposed above the electrode layer are firmly bonded to each other, the wiring pattern and the insulating layer are hardly peeled off each other. Therefore, the piezoelectric/electrostrictive layer disposed on the wiring pattern is prevented from peeling off, making it possible to sufficiently perform the functions of an actuator or sensor device which employs the piezoelectric/electrostrictive layer.

The wiring pattern and the insulating layer may have respective sides that are exposed outwardly, e.g., in contact with air. As the layer (the piezoelectric/electrostrictive layer or the like) on the wiring pattern is less likely to peel off, even though the sides of the wiring pattern and the insulating layer are exposed outwardly, the piezoelectric/electrostrictive layer is prevented from peeling off when the wiring board is cut off or cleaned, and the time required to process, i.e., cut off or clean the wiring board, can be shortened.

The ceramic substrate may comprise a thick support block and a vibratable portion contiguous to the support block and thinner than the support block, the wiring pattern extending from the vibratable portion to the support block, the insulating layer being disposed on the support block.

With the above arrangement, the firm adhesion between the wiring pattern and the insulating layer is not weakened when the vibratable portion vibrates, and hence the wiring board has increased reliability.

According to still another aspect of the present invention, a wiring board is provided, including a ceramic substrate and a wiring pattern disposed as an electrode layer on the ceramic substrate. The wiring pattern includes a first layer made of a cermet containing a material from which the ceramic substrate is made and an electrically conductive material. In addition, the wiring pattern preferably includes a second layer made of an electrically conductive material. Preferably, the electrically conductive material is the material from which the electrode layer is made.

Because the material of the ceramic substrate constituting the cermet of the wiring pattern and the lower ceramic substrate are firmly bonded to each other, the wiring pattern is prevented from peeling off the ceramic substrate.

The wiring pattern has gaps which may be filled with an insulating layer made of a cermet. The insulating layer may comprise a cermet layer containing a material of which the electrode layer is made. The wiring board may further include a piezoelectric/electrostrictive layer disposed on the wiring pattern. The wiring pattern has gaps which may be filled with an insulating layer made of a cermet, or preferably, an insulating layer comprising a cermet layer containing a material of which the piezoelectric/electrostrictive layer is made. The wiring pattern and the insulating layer may have respective sides exposed outwardly.

In the above wiring board, the wiring pattern may have a third layer including a cermet of a piezoelectric/electrostrictive material and an electrically conductive material. The bonding strength between the wiring pattern and the ceramic substrate positioned therebeneath is increased, and the bonding strength between the wiring pattern and the piezoelectric/electrostrictive layer positioned thereover is increased, making the wiring board highly resistant to peeling.

The ceramic substrate may comprise a thick support block and a vibratable portion contiguous to the support block and thinner than the support block, the wiring pattern extending from the vibratable portion to the support block. Alternatively, the ceramic substrate may comprise a thick support block and a vibratable portion contiguous to the support block and thinner than the support block, the wiring pattern extending from the vibratable portion to the support block, the insulating layer being disposed on the support block.

According to yet another aspect of the present invention, a method of manufacturing a wiring board having a ceramic substrate and a wiring pattern disposed as an electrode layer on the ceramic substrate is provided, including the steps of shaping a raw material containing a ceramic material and firing the shaped raw material into a ceramic substrate. The method also includes the steps of forming on the ceramic substrate a first cermet, containing an electrode material, to be the wiring pattern and a second cermet, containing an electrically conductive material which will become an insulating layer, filling gaps in the wiring pattern according to a printing process, and thereafter, firing the first and second cermets to produce the wiring pattern and the insulating layer on the ceramic substrate.

Accordingly, a wiring board is produced which includes a wiring pattern having gaps filled with an insulating layer made of a cermet containing an electrically conductive material. Since the gaps in the wiring pattern are filled with the insulating layer, another layer which may be formed on the wiring pattern is held against the wiring pattern and the insulating layer in the gaps, and hence does not tend to peel off.

If the layer on the wiring pattern is made of a material that easily adheres to the material of the electrode layer, then the layer on the wiring pattern is firmly bonded to the wiring pattern and the insulating layer, and is more resistant to peeling off.

With the above arrangement, a laminated assembly of the wiring board is prevented from peeling off, the number of man hours involved in manufacturing the wiring board is reduced, and the throughput of the wiring board is increased. In addition, the functions of the wiring board are prevented from being lowered.

The method may further include the steps of forming a paste of a piezoelectric/electrostrictive material on the wiring pattern according to a printing process, and firing the paste to form a piezoelectric/electrostrictive layer on the wiring pattern. The piezoelectric/electrostrictive layer thus disposed on the wiring pattern is also prevented from peeling off, and allows an actuator or sensor device using a piezoelectric/electrostrictive layer to perform its functions fully.

According to yet another aspect of the present invention, a method of manufacturing a wiring board having a ceramic substrate and a wiring pattern disposed as an electrode layer on the ceramic substrate is provided, including the steps of shaping a raw material containing a ceramic material and firing the shaped raw material into a ceramic substrate. The method also includes the steps of forming on the ceramic substrate a first cermet containing an electrically conductive material to be the wiring pattern and a second cermet containing a material of a piezoelectric/electrostrictive layer to be an insulating layer filling gaps in the wiring pattern, according to a printing process, and thereafter firing the first and second cermets to produce the wiring pattern and the insulating layer on the ceramic substrate. A paste of a piezoelectric/electrostrictive material is formed on the wiring pattern according to a printing process, and thereafter, the paste is fired to produce a piezoelectric/electrostrictive layer on the wiring pattern.

Inasmuch as the layer on the wiring pattern is the piezoelectric/electrostrictive layer, which is liable to adhere to the material of the electrode layer, the wiring pattern and the piezoelectric/electrostrictive layer do not tend to peel off each other. As the piezoelectric/electrostrictive material which makes up the insulating layer and the piezoelectric/electrostrictive layer positioned thereabove are firmly bonded to each other, the wiring pattern and the insulating layer do not tend to peel off each other. Therefore, the piezoelectric/electrostrictive layer disposed on the wiring pattern is prevented from peeling off, allowing an actuator or sensor device using a piezoelectric/electrostrictive layer to perform its functions fully.

According to yet another aspect of the present invention, a method of manufacturing a wiring board having a ceramic substrate and a wiring pattern disposed as an electrode layer on the ceramic substrate is provided, including the steps of shaping a raw material containing a ceramic material and firing the shaped raw material into a ceramic substrate. The method also includes the steps of forming on the ceramic substrate a cermet containing at least a material from which the ceramic substrate is made and an electrically conductive material, and a paste of an electrically conductive material, according to a printing process, and thereafter firing the cermet and the paste to produce the wiring pattern on the ceramic substrate.

Since the wiring pattern and the ceramic substrate positioned therebeneath are firmly bonded to each other, the wiring pattern is resistant to peeling off the ceramic substrate.

In the above method, the steps of forming and firing include the steps of forming the cermet containing the material from which the ceramic substrate is made and the electrically conductive material on the ceramic substrate according to a printing process, and thereafter, firing the cermet to produce a first layer made of the cermet, forming the paste of the electrically conductive material on the first layer according to a printing process, and thereafter firing the paste to produce a second layer made of the paste, and forming the wiring pattern made of at least the first and second layers on the ceramic substrate.

The method may further include the steps of forming a paste of a piezoelectric/electrostrictive material on the wiring pattern according to a printing process, and thereafter, firing the paste to produce a piezoelectric/electrostrictive layer on the wiring pattern.

In the above method, the steps of forming and firing may include the steps of forming the cermet containing the material of which the ceramic substrate is made and the electrically conductive material on the ceramic substrate, and thereafter firing the cermet to produce a first layer made of the cermet, forming a paste of an electrode material on the first layer, and thereafter firing the paste to form a second layer of the electrode material, forming a cermet containing the piezoelectric/electrostrictive material and an electrically conductive material on the second layer, and thereafter firing the cermet to produce a third layer made of the cermet, and forming the wiring pattern made of the first, second, and third layers on the ceramic substrate.

Alternatively, the steps of forming and firing may include the steps of forming on the ceramic substrate a first cermet, containing an electrically conductive material to be the wiring pattern and a material of the piezoelectric/electrostrictive layer, to be an insulating layer filling gaps in the wiring pattern, according to a printing process, and thereafter, firing the first cermet and the second cermet to produce the wiring pattern and the insulating layer on the ceramic substrate.

Alternatively, the steps of forming and firing may include the steps of forming a first cermet containing an electrically conductive material to be the wiring pattern and an electrically conductive material to be an insulating layer filling gaps in the wiring pattern, on the ceramic substrate according to a printing process, and thereafter firing the first cermet and the second cermet to produce the wiring pattern and the insulating layer on the ceramic substrate.

The electrically conductive material may be a material of which the electrode layer is made.

The above and other objects, features, and advantages according to the present invention will become more apparent from the following description when taken in conjunction with the accompanying drawings in which preferred embodiments according to the present invention are shown by way of illustrative example.

BRIEF DESCRIPTION OF THE DRAWINGS

FIG. 14 is a perspective view of a laminated ceramic assembly produced by firing the ceramic green assembly, with piezoelectric/electrostrictive elements mounted on the laminated ceramic assembly.

DETAILED DESCRIPTION OF THE INVENTION

Figure 1:
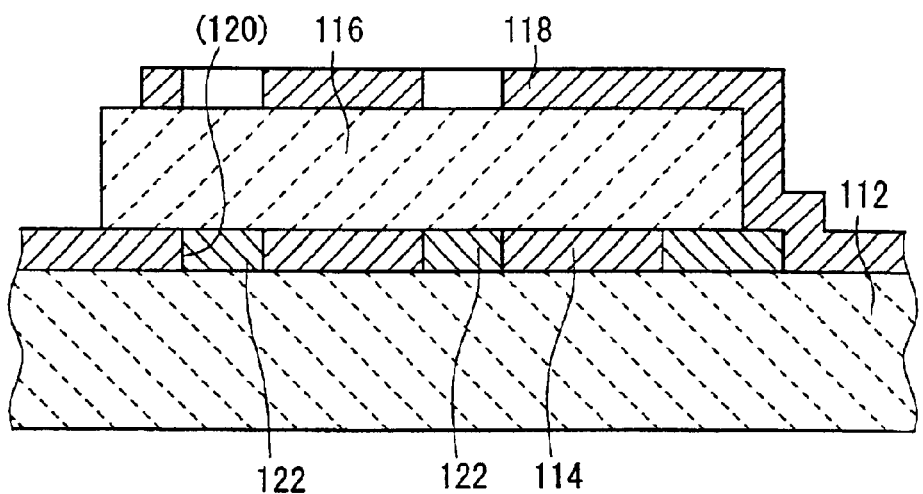
FIG. 1 is a fragmentary cross-sectional view of a wiring board of a first embodiment according to the present invention.

Like or corresponding parts are denoted by like or corresponding reference characters throughout the views described below.

As shown in FIG. 1, a wiring board 110A according to a first embodiment of the present invention includes a ceramic substrate 112, a first wiring pattern 114 disposed as a lower electrode layer on the ceramic substrate 112, a piezoelectric/electrostrictive layer 116 disposed on the first wiring pattern 114, and a second wiring pattern 118 disposed as an upper electrode layer on the piezoelectric/electrostrictive layer 116.

Figure 2A:
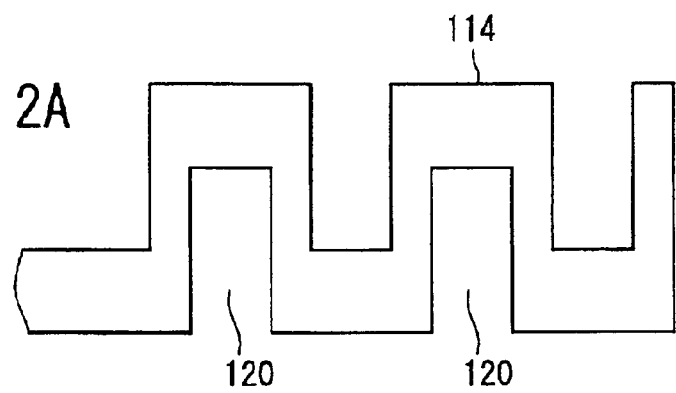
FIG. 2A is a plan view of a first wiring pattern on the wiring board shown in FIG. 1.
Figure 2B:
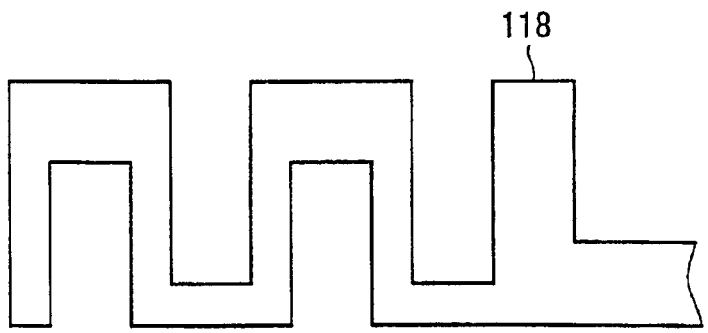
FIG. 2B is a plan view of a second wiring pattern on the wiring board shown in FIG. 1.

As shown in FIGS. 2A and 2B, the first and second wiring patterns 114, 118 have a meandering shape, for example.

The first and second wiring patterns 114, 118 and the piezoelectric/electrostrictive layer 116 are formed on the ceramic substrate 112 in the following manner. First, a cermet containing an electrode material is deposited on the ceramic substrate 112 and then fired to form the first electrode pattern 114 of the electrode material. Thereafter, a paste of a piezoelectric/electrostrictive material is deposited and then fired to form the piezoelectric/electrostrictive layer 116 of the piezoelectric/electrostrictive material. Then, a cermet containing an electrode material is deposited on the piezoelectric/electrostrictive layer 116, and thereafter, is fired to form the second electrode pattern 118 of the electrode material. When the above sequence of steps is finished, the wiring board 110A according to the first embodiment of the present invention is fabricated.

As shown in FIG. 2A, regions free of an electrode layer, i.e., gaps 120, are provided on the ceramic substrate 112 due to the meandering configuration of the first wiring pattern 114. In the gaps 120, the ceramic substrate 112 and the piezoelectric/electrostrictive layer 116 confront each other. The gaps 120 are produced because the material of the ceramic substrate 112 (substrate material) and the material of the piezoelectric/electrostrictive layer 116 (piezoelectric/electrostrictive material) are hardly joined to each other.

The gaps 120 would leave the piezoelectric/electrostrictive layer 116 partly floating off the ceramic substrate 112. The floating portions of the piezoelectric/electrostrictive layer 116 would not be positionally secure with respect to the ceramic substrate 112, and could freely move by external forces. Therefore, the piezoelectric/electrostrictive layer 116 would tend to peel off.

In the first embodiment, however, as shown in FIG. 1, the gaps 120 provided by the meandering first wiring pattern 114 are filled with an insulating layer 122 of a cermet containing an electrode material or cermet containing a piezoelectric/electrostrictive material. In FIG. 1, the gaps 120 are filled with the insulating layer 122, and not shown. Therefore, the reference numeral "120" for the gaps is indicated in parentheses in FIG. 1.

If the insulating layer 122 is made of a cermet containing an electrode material, then since the piezoelectric/electrostrictive layer 116 formed on the first wiring pattern 114 adheres easily to the electrode material, the piezoelectric/electrostrictive layer 116 is firmly bonded to the first wiring pattern 114 and the insulating layer 122. Therefore, the piezoelectric/electrostrictive layer 116 on the first wiring pattern 114 is prevented from peeling off.

If the insulating layer 122 is made of a cermet containing a piezoelectric/electrostrictive material, then the piezoelectric/electrostrictive layer 116 formed on the first wiring pattern 114 adheres easily to the electrode material, the piezoelectric/electrostrictive layer 116 is firmly bonded to the first wiring pattern 114. As the insulating layer 122 contains a piezoelectric/electrostrictive material, the piezoelectric/electrostrictive layer 116 is also firmly bonded to the insulating layer 122. As a result, the piezoelectric/electrostrictive layer 116 on the first wiring pattern 114 is prevented from peeling off.

In the first embodiment, therefore, the piezoelectric/electrostrictive layer 116 of the wiring board 110A is prevented from peeling off. The man hours in the fabrication of the wiring board 110A are reduced and the throughput thereof is increased, and the functions of the wiring board 110A are prevented from being deteriorated.

A process of manufacturing the wiring board 110A of the first embodiment will be described below with reference to FIGS. 3A through 4B. In this process, the insulating layer 122 is made of a cermet containing an electrode material.

Figure 3A:
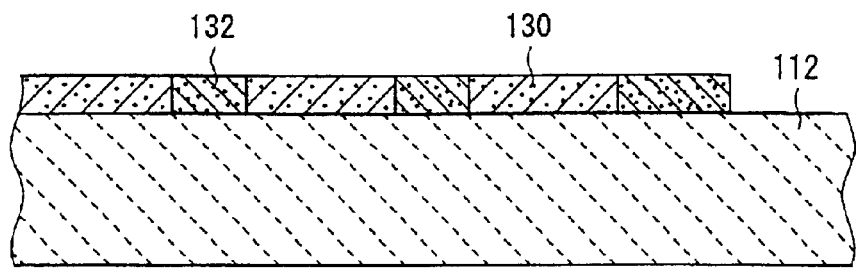
FIG. 3A is a fragmentary cross-sectional view showing a fabrication stage where a first cermet layer to be a first wiring pattern and a second cermet layer to be an insulating pattern are formed on a ceramic substrate in a process of manufacturing the wiring board of the first embodiment.

First, as shown in FIG. 3A, a raw material containing a ceramic material is shaped and fired into the ceramic substrate 112. Then, a first cermet layer 130 of a cermet containing an electrode material such as Pt/zirconia is formed on the ceramic substrate 112 according to a screen printing process, for example. Thereafter, a second cermet layer 132 of a cermet containing an electrode material, e.g., Pt/zirconia, is formed on an exposed region of the ceramic substrate 112 according to a screen printing process.

Figure 3B:
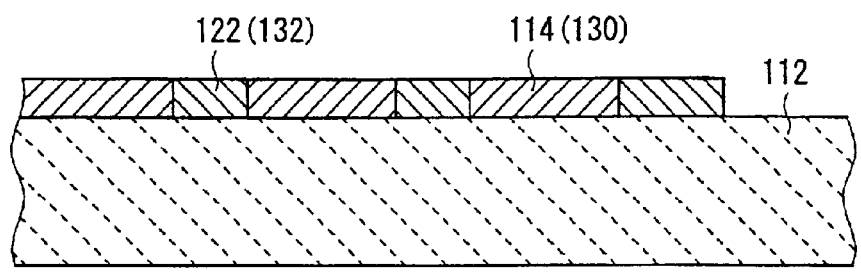
FIG. 3B is a fragmentary cross-sectional view showing a fabrication stage where the first wiring pattern and the insulating layer are simultaneously formed.
Figure 3C:
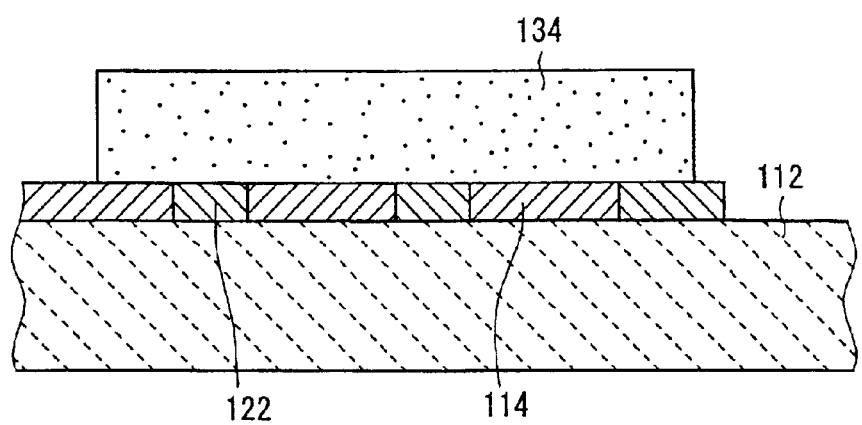
FIG. 3C is a fragmentary cross-sectional view showing a fabrication stage where a PZT paste to be a piezoelectric/electrostrictive layer is formed.
Figure 4A:
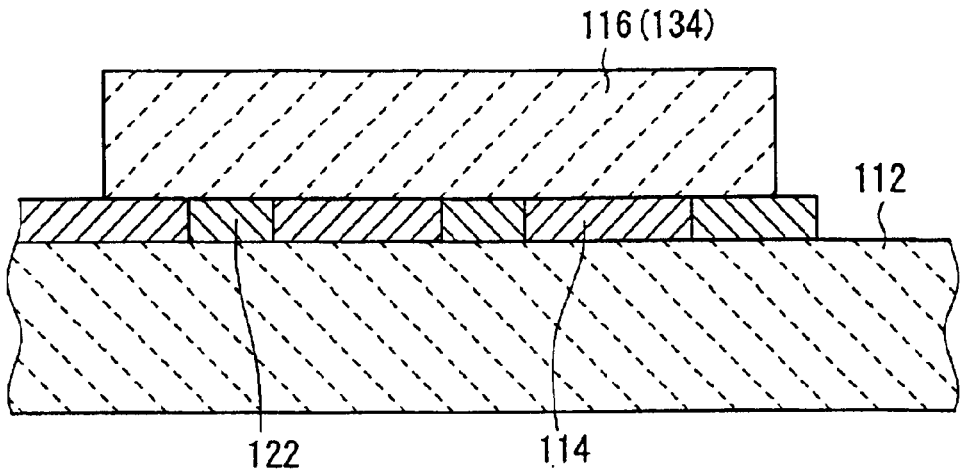
FIG. 4A is a fragmentary cross-sectional view showing a fabrication stage where the piezoelectric/electrostrictive layer is formed in the process of manufacturing the wiring board of the first embodiment.

As shown in FIG. 3B, the first cermet layer 130 and the second cermet layer, 132 are then fired into the first wiring pattern 114 and the insulating layer 122, respectively. Then, as shown in FIG. 3C, a paste of a piezoelectric/electrostrictive material, e.g., a PZT paste 134, is formed on the first wiring pattern 114 and the insulating layer 122 according to a screen printing process, for example. Thereafter, as shown in FIG. 4A, the PZT paste 134 is fired into the piezoelectric/electrostrictive layer 116.

Figure 4B:
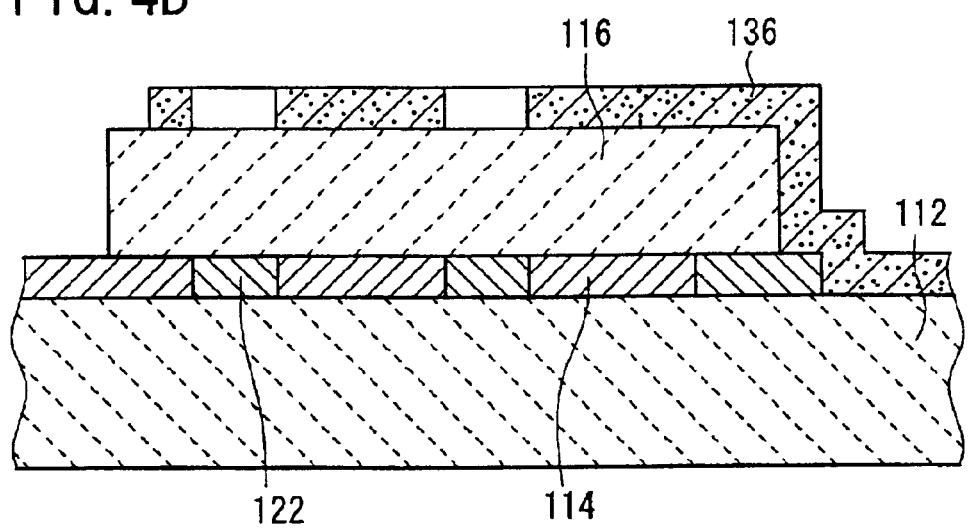
FIG. 4B is a fragmentary cross-sectional view showing a fabrication stage where a third cermet layer to be a second wiring pattern is formed.

Then, as shown in FIG. 4B, a third cermet layer 136 of a cermet containing an electrode material, e.g., Pt/zirconia, is formed on the piezoelectric/electrostrictive layer 116 according to a screen printing process, for example.

Subsequently, the third cermet layer 136 is fired into the second wiring pattern 118, thus completing the wiring board 110A shown in FIG. 1.

The above manufacturing process enables inexpensive and easy fabrication of the wiring board 110A in which the piezoelectric/3w34electrostrictive layer 116 is highly reliably prevented from easily peeling off.

If the insulating layer 122 is made of a cermet containing an electrode material, then it is preferable to make the amount of the electrode material smaller than the amount of the ceramic material in order to keep the insulating capability of the insulating layer 122.

The insulating capability of the insulating layer 122 can be adjusted by (1) increasing the ratio of ceramics as an insulating material to a metal as an electrode material, (2) increasing the crystal grain of the ceramics, and (3) lowering the firing temperature. If a ceramic material is to be mixed, then the ceramic material may be the piezoelectric/electrostrictive material or the substrate material or mixed material of both.

A wiring board 110B according to a second embodiment of the present invention will be described below with reference to FIGS. 5 through 8C.

Figure 5:
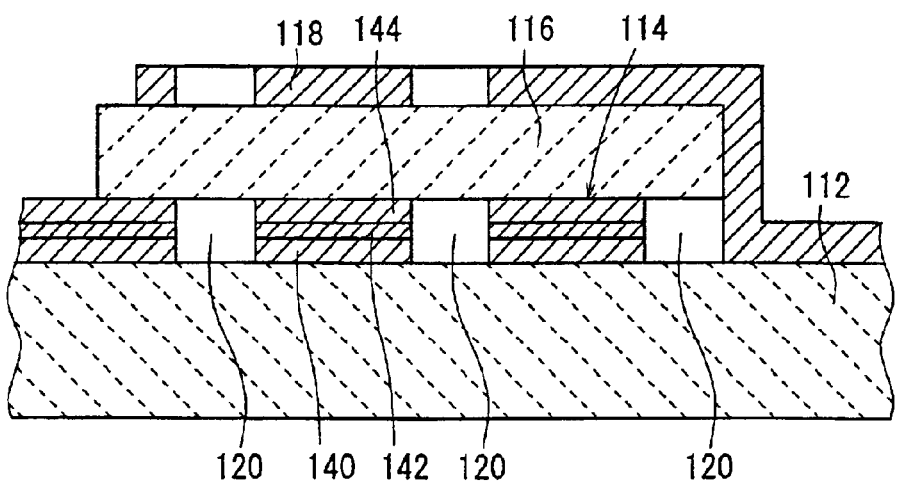
FIG. 5 is a fragmentary cross-sectional view of a wiring board of a second embodiment according to the present invention.

As shown in FIG. 5, the wiring board 110B of the second embodiment is substantially similar to the wiring board 110A of the first embodiment, but differs therefrom in that the first wiring pattern 114 is a three-layer structure, and the gaps 120 in the first wiring pattern 114 are not filled with the insulating layer 122.

The first wiring pattern 114 comprises a first layer 140, a second layer 142, and a third layer 144. The first layer 140 is disposed directly on the ceramic substrate 112, and is made of the cermet of the substrate material and the electrode material. The second layer 142 is disposed on the first layer 140, and is made of the electrode material. The third layer 144 is disposed on the second layer 142, and is made of the cermet of the piezoelectric/electrostrictive material and the electrode material.

Since the first layer 140 of the first wiring pattern 114 is made of the cermet containing the substrate material, the first layer 140 and the ceramic substrate 112 are firmly bonded to each other. Furthermore, since the third layer 144 of the first wiring pattern 114 is made of the cermet containing the piezoelectric/electrostrictive material, the third layer 144 and the piezoelectric/electrostrictive layer 116 are firmly bonded to each other.

Therefore, the first wiring pattern 114 is firmly bonded to the lower ceramic substrate 112 and also to the upper piezoelectric/electrostrictive layer 116. Even though the first wiring pattern 114 has the gaps 120, the piezoelectric/electrostrictive layer 116 is prevented from peeling off.

The process of manufacturing the wiring board 110B of the second embodiment will be described below with reference to FIGS. 6A through 8C.

Figure 6A:
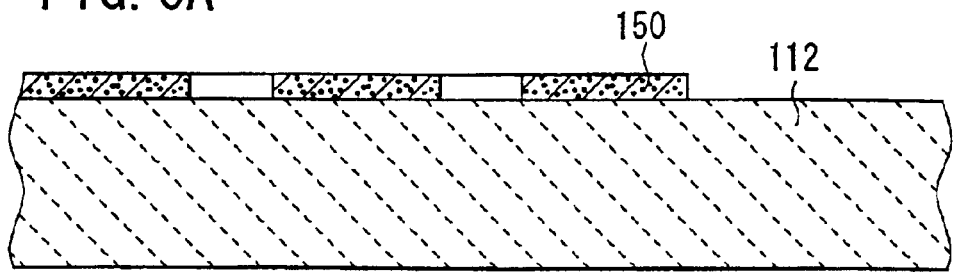
FIG. 6A is a fragmentary cross-sectional view showing a fabrication stage where a first cermet layer to be a first layer of a first wiring pattern is formed on a ceramic substrate in a process of manufacturing the wiring board of the second embodiment.
Figure 6B:
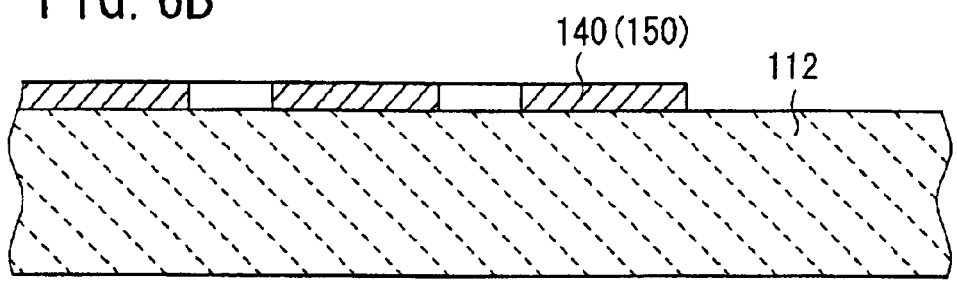
FIG. 6B is a fragmentary cross-sectional view showing a fabrication stage where the first layer is formed.

First, as shown in FIG. 6A, a raw material containing a ceramic material is shaped and fired into the ceramic substrate 112. A first cermet layer 150 of a cermet containing an electrode material and a substrate material, e.g., Pt/zirconia, is then formed on the ceramic substrate 112 according to a screen printing process, for example. Thereafter, as shown in FIG. 6B, the first cermet layer 150 is fired into the first layer 140.

Figure 6C:
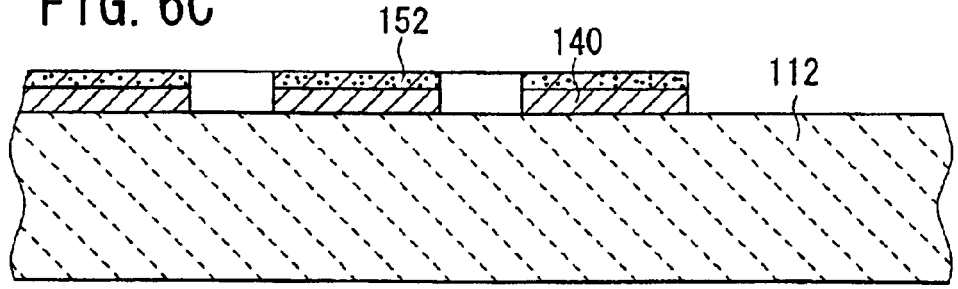
FIG. 6C is a fragmentary cross-sectional view showing a fabrication stage where a Pt paste to be a second layer of the wiring pattern is formed.

Next, as shown in FIG. 6C, a paste of an electrode material, e.g., a PZT paste 152, is formed on the first layer 140 according to a screen printing process, for example.

Figure 7A:
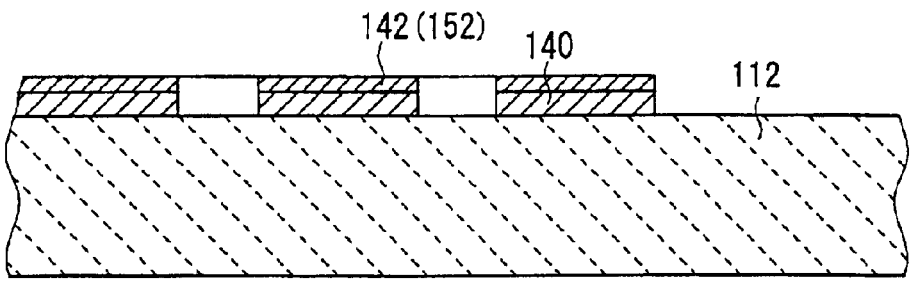
FIG. 7A is a fragmentary cross-sectional view showing a fabrication stage where the second layer is formed in the process of manufacturing the wiring board of the second embodiment.
Figure 7B:
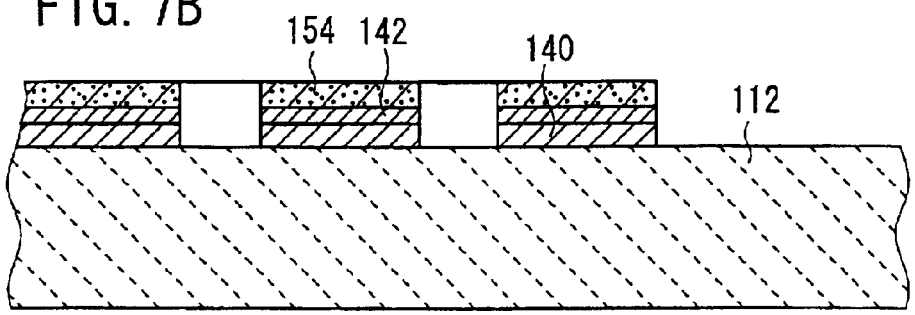
FIG. 7B is a fragmentary cross-sectional view showing a fabrication stage where a second cermet layer to be a third layer of the first wiring pattern is formed in the process of manufacturing the wiring board of the second embodiment.
Figure 7C:
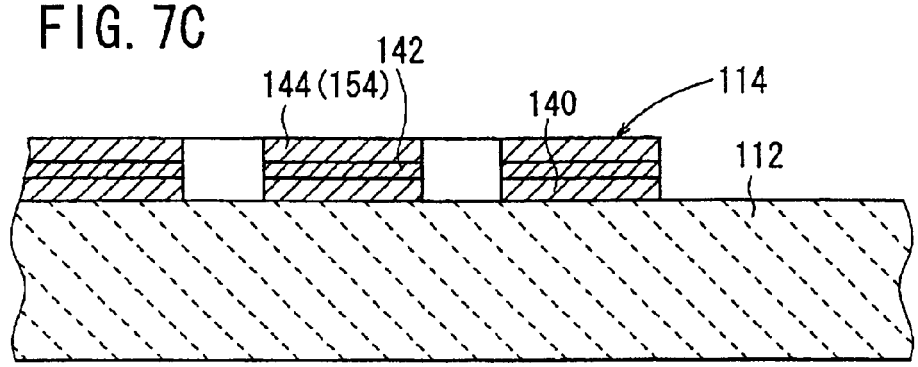
FIG. 7C is a fragmentary cross-sectional view showing a fabrication stage where the third layer is formed.

Thereafter, as shown in FIG. 7A, the PZT paste 152 is fired into the second layer 142. As shown in FIG. 7B, a second cermet layer 154 made of a cermet containing an electrode material and a piezoelectric/electrostrictive material, e.g., Pt/PZT, is then formed on the second layer 142 according to a screen printing process, for example. Thereafter, as shown in FIG. 7C, the second cermet layer 154 is fired into the third layer 144. At this stage, the first wiring pattern 114 comprising a laminated assembly of the first, second, and third layers 140, 142, 144 is formed on the ceramic substrate 112.

Figure 8A:
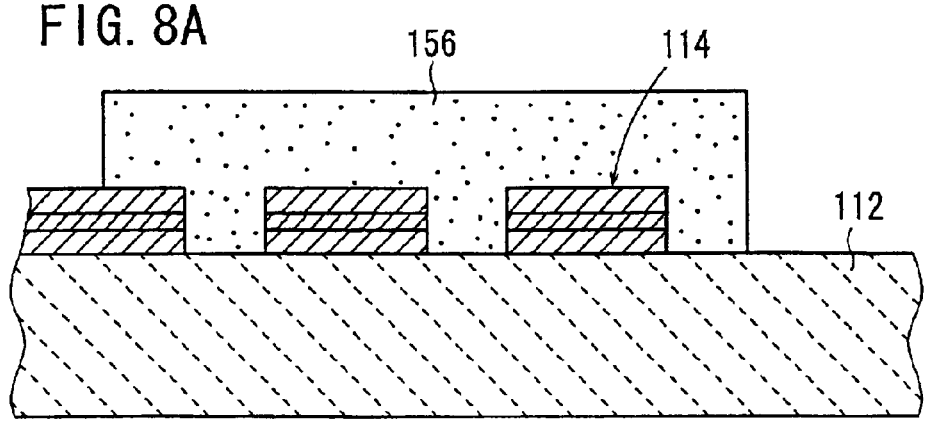
FIG. 8A is a fragmentary cross-sectional view showing a fabrication stage where a PZT paste to be a piezoelectric/electrostrictive layer is formed in the process of manufacturing the wiring board of the second embodiment.
Figure 8B:
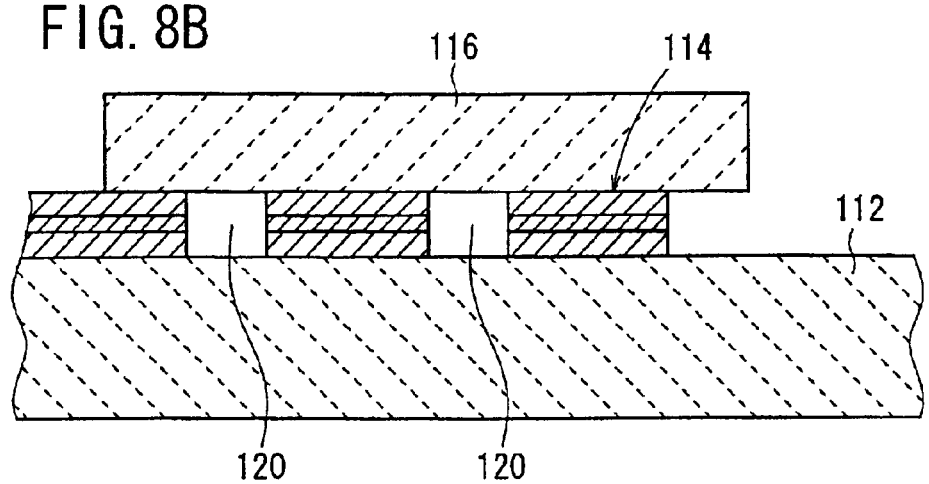
FIG. 8B is a fragmentary cross-sectional view showing a fabrication stage where the piezoelectric/electrostrictive layer is formed.

As shown in FIG. 8A, a paste of a piezoelectric/ electrostrictive material, e.g., a PZT paste 156, is then formed according to a screen printing process, for example. At this time, the PZT paste 156 enters the gaps 120 in the first wiring pattern 114. Thereafter, as shown in FIG. 8B, the PZT paste 156 is fired into the piezoelectric/electrostrictive layer 116. At this time, the portions of the PZT paste 156 which are held in contact with the ceramic substrate 112 are shrunk when the PZT paste 156 is fired. When the PZT paste 156 is fired into the piezoelectric/electrostrictive layer 116, those shrunk portions leave the gaps 120 in the first wiring pattern 114.

Figure 8C:
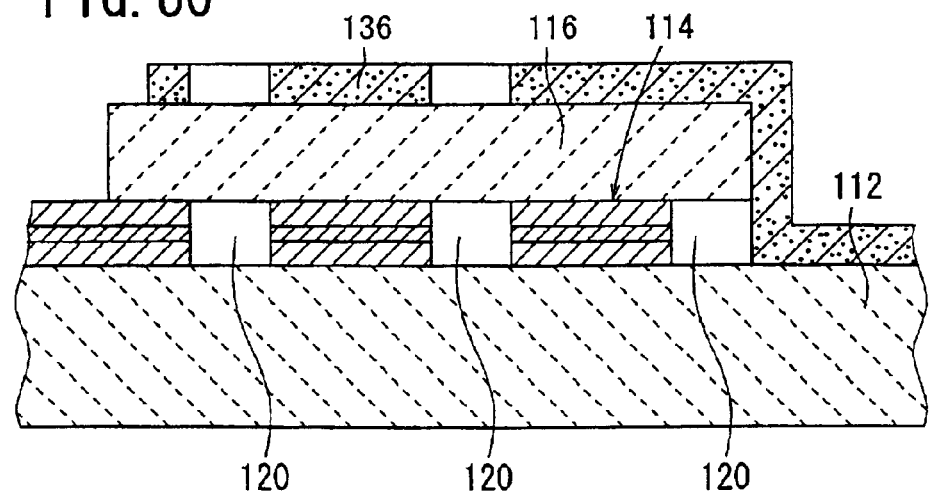
FIG. 8C is a fragmentary cross-sectional view showing a fabrication stage where a third cermet layer to be a second wiring pattern is formed.

As shown in FIG. 8C, a third cermet layer 136 made of a cermet containing an electrode material, e.g., Pt/zirconia, is then formed on the piezoelectric/electrostrictive layer 116 according to a screen printing process, for example. Thereafter, the third cermet layer 136 is fired into the second wiring pattern 118. In this manner, the wiring board 110B of the second embodiment is fabricated.

According to the above manufacturing process, the wiring board 110B can be inexpensively and easily fabricated, and the piezoelectric/electrostrictive layer 116 is highly reliably prevented from easily peeling off even if the gaps 120 are in the first wiring pattern 114.

A wiring board 110C according to a third embodiment of the present invention will be described below with reference to FIG. 9.

Figure 9:
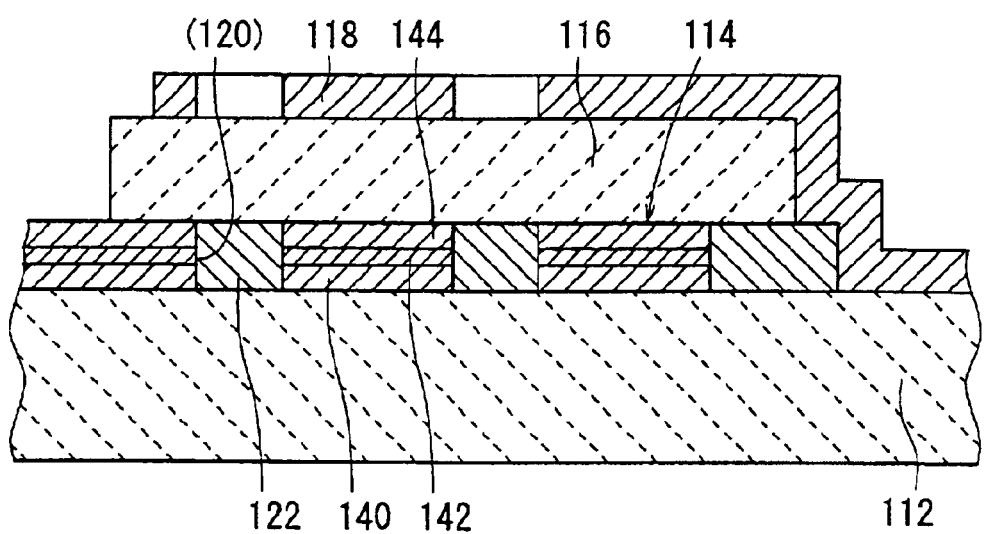
FIG. 9 is a fragmentary cross-sectional view of a wiring board of a third embodiment according to the present invention.

As shown in FIG. 9, the wiring board 110C according to the third embodiment of the present invention is substantially similar to the wiring board 110B of the second embodiment, but differs therefrom in that the gaps 120 in the first wiring pattern 114 are filled with the insulating layer 122. The wiring board 110C according to the third embodiment is thus a combination of the wiring boards 110A, 110B of the first and second embodiments according to the present invention.

The insulating layer 122 is made of a cermet containing an electrode material or a cermet containing a piezoelectric/ electrostrictive material.

With the wiring board 110C of the third embodiment, the first wiring pattern 114 is firmly bonded to the ceramic substrate 112 and also to the piezoelectric/electrostrictive layer 116. Since the insulating layer 122 fills the gaps 120 in the first wiring pattern 114, the piezoelectric/electrostrictive layer 116 does not have any portions floating over the gaps 120. Accordingly, the piezoelectric/electrostrictive layer 116 is prevented from peeling off when the wiring board 110C is machined or cleaned.

A piezoelectric/electrostrictive device 10 according to another embodiment of the present invention, which incorporates the wiring board 110C of the third embodiment, will be described below with reference to FIGS. 10 through 19B.

The piezoelectric/electrostrictive device 10 can be operated as a device for converting electric energy into mechanical energy with a piezoelectric/electrostrictive element or a device for converting mechanical energy into electric energy with a piezoelectric/electrostrictive element. Therefore, the piezoelectric/electrostrictive device 10 can be used as active devices such as various actuators and vibrators and also as passive devices such as acceleration sensors and impact sensors.

Figure 10:
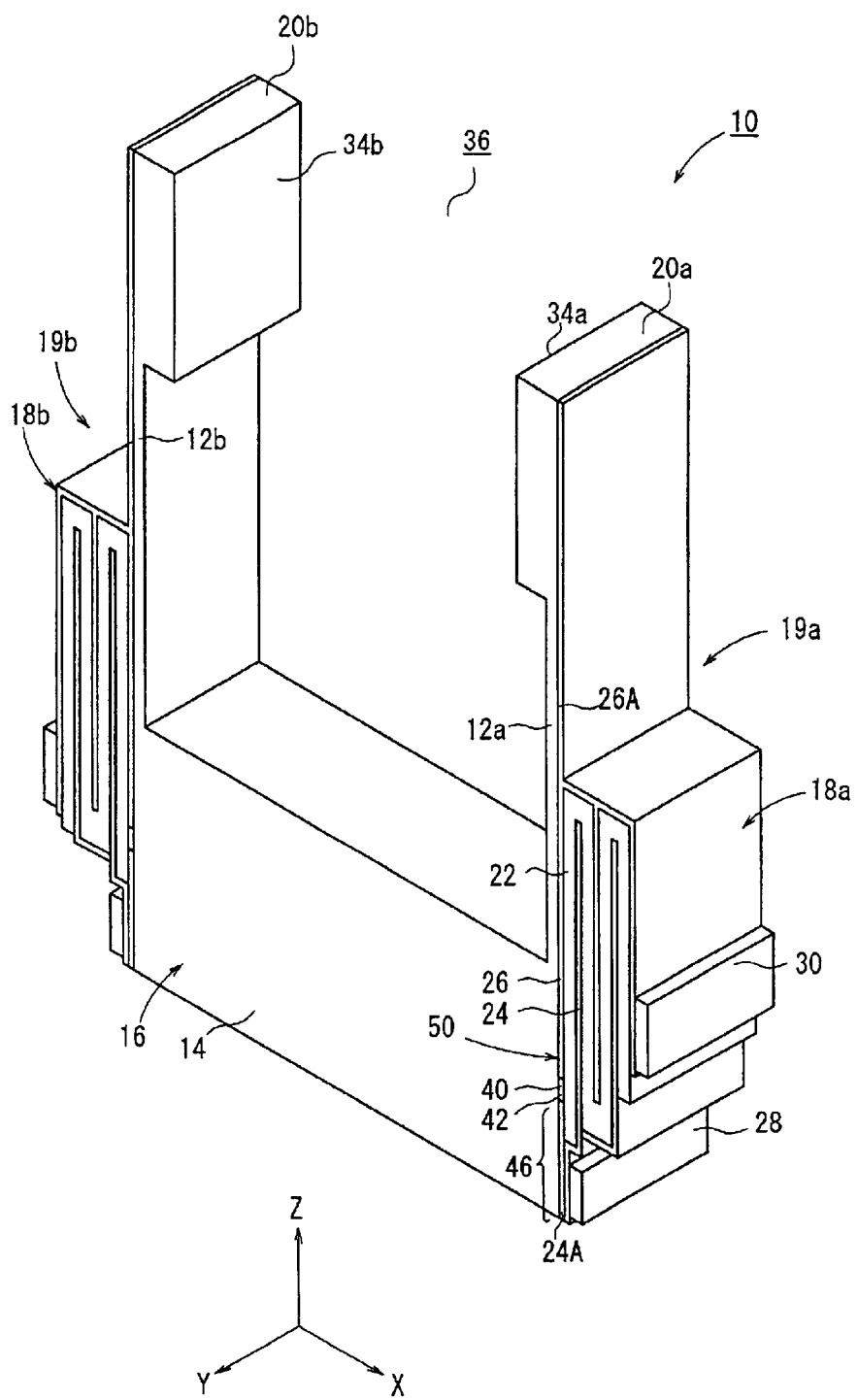
FIG. 10 is a perspective view of a piezoelectric/electrostrictive device of a specific embodiment according to the present invention.

As shown in FIG. 10, the piezoelectric/electrostrictive device 10 comprises a unitary ceramic substrate 16 having a pair of thin plates 12a, 12b spaced from and confronting each other and a support block 14 supporting the thin plates 12a, 12b, and a pair of piezoelectric/electrostrictive elements 18a, 18b mounted respectively on the thin plates 12a, 12b.

When the piezoelectric/electrostrictive element 18a and/ or the piezoelectric/electrostrictive element 18b is energized, the thin plates 12a, 12b are displaced. Alternatively, a displacement of the thin plates 12a, 12b is detected by the piezoelectric/electrostrictive element 18a and/or the piezoelectric/electrostrictive element 18 b.

The thin plates 12a, 12b and the piezoelectric/ electrostrictive elements 18a, 18b jointly make up actuators 19a, 19b. The thin plates 12a, 12b function as vibrators that are vibratably supported on the support block 14.

The thin plates 12a, 12b have respective tip end portions that are progressively thicker inwardly and function as movable portions 20a, 20b which are displaced as the thin plates 12a, 12b are displaced. The tip end portions of the thin plates 12a, 12b will hereinafter be referred to as the movable portions 20a, 20b, respectively.

The movable portions 20a, 20b have end faces 34a, 34b confronting each other. A gap (air) 36 may be interposed between the end faces 34a, 34b, or a plurality of members made of a material which may be the same as or different from the material of the movable portions 20a, 20b may be interposed between the end faces 34a, 34b. If the plurality of members are thus interposed between the end faces 34a, 34b, the end faces 34a, 34b function as attachment faces 34a, 34b to which the plurality of members are attached.

The ceramic substrate 16 comprises a laminated ceramic assembly of ceramic green sheets which are fired into a unitary structure, for example, as described later on. The unitary laminated ceramic assembly is substantially free of aging because no adhesive is present in the joints between the ceramic green sheets. Therefore, the unitary laminated ceramic assembly is highly reliable at the joints between the ceramic green sheets and has an advantageous structure for achieving the desired rigidity. The unitary laminated ceramic assembly can easily be manufactured according to the ceramic green sheet laminating process described later on.

The piezoelectric/electrostrictive elements 18a, 18b are preferably fabricated according to a process described below. The piezoelectric/electrostrictive elements 18a, 18b are prepared as separate elements as described later on, and then directly formed on the ceramic substrate 16 according to a film forming method.

The piezoelectric/electrostrictive elements 18a, 18b each have a piezoelectric/electrostrictive layer 22 and a pair of electrodes 24, 26 disposed on each side of the piezoelectric/ electrostrictive layer 22. Of the electrodes 24, 26, the electrode 24 is formed on at least the thin plates 12a, 12b.

In each of the piezoelectric/electrostrictive elements 18a, 18b, the piezoelectric/electrostrictive layer 22 and the electrodes 24, 26 have a multilayer structure. More specifically, the electrodes 24, 26 are comb-toothed and combined with each other in an interdigitating relationship. The electrodes 24, 26 and the piezoelectric/electrostrictive layer 22 are laminated in a multistage structure comprising multiple layers or stages each having the piezoelectric/electrostrictive layer 22 sandwiched between the electrodes 24, 26. The number of multiple layers or stages is not limited to any value, but should preferably be 10 or smaller, and more preferably be 5 or smaller. However, each of the piezoelectric/electrostrictive elements 18a, 18b may have a single-stage structure.

Figure 11:
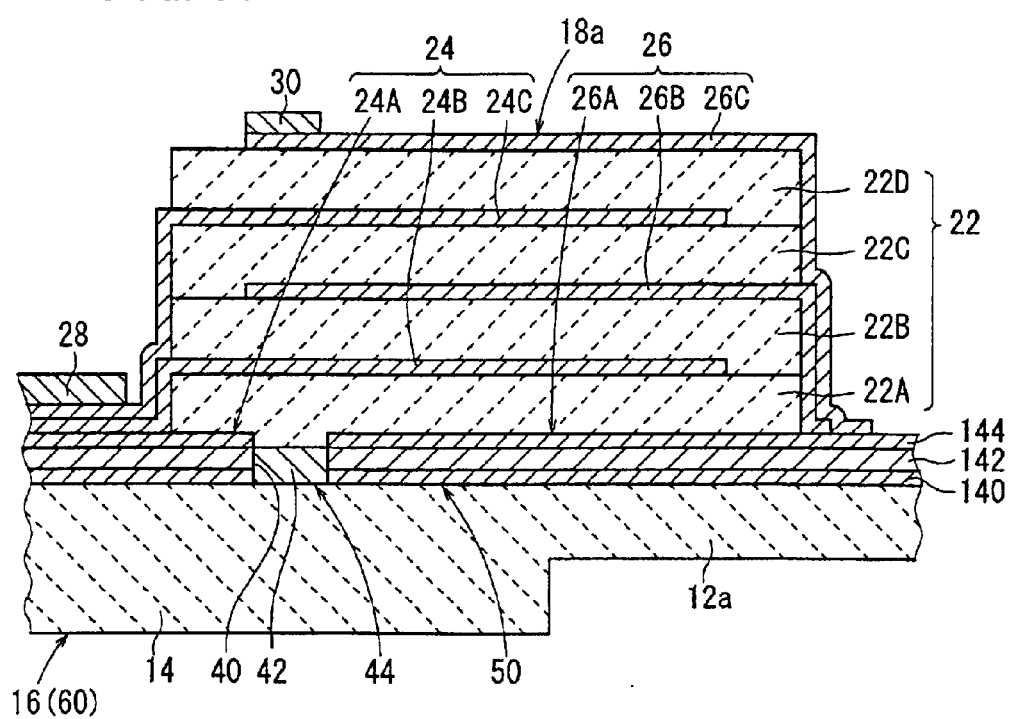
FIG. 11 is an enlarged cross-sectional view of a piezoelectric/electrostrictive element of the piezoelectric/electrostrictive device.

According to the embodiment shown in FIG. 11, the piezoelectric/electrostrictive layer 22 of each of the piezoelectric/electrostrictive elements 18a, 18b has a four-layer structure comprising first, second, third, and fourth piezoelectric/electrostrictive layers 22A, 22B, 22C, 22D. A first wiring pattern 50 extends substantially continuously over respective sides of the thin plates 12a, 12b, the movable portions 20a, 20b, and the support block 14 of the ceramic substrate 16. The first wiring pattern 50 is divided into a portion 24A (which constitutes the electrode 24) and another portion 26A (which constitutes the electrode 26) on one side of the support block 14 by a gap 40. The gap 40 is filled with an insulating layer 42, and functions as an insulator 44 in the first wiring pattern 50.

The electrode 24 has a comb-toothed shape including the portion 24A of the first wiring pattern 50, a second wiring pattern 24B mounted on an upper surface of the first piezoelectric/electrostrictive layer 22A, and a fourth wiring pattern 24C mounted on an upper surface of the third piezoelectric/electrostrictive layer 22C. The electrode 26 has a comb-toothed shape including the portion 26A of the first wiring pattern 50, a third wiring pattern 26B mounted on an upper surface of the second piezoelectric/electrostrictive layer 22B, and a fifth wiring pattern 26C mounted on an upper surface of the fourth piezoelectric/electrostrictive layer 22D.

The portion 24A of the first wiring pattern 50, the second wiring pattern 24B, and the fourth wiring pattern 24C have portions that are combined into a laminated region on which a terminal 28 is mounted. Another terminal 30 is mounted on an end of the fifth wiring pattern 26C of the electrode 26 which is disposed as the uppermost layer on the piezoelectric/electrostrictive layer 22.

The insulator 44 is effective not to operate an actuator in a rear end portion 46 of each of the piezoelectric/electrostrictive elements 18a, 18b, i.e., a portion extending from the rear end of the gap 40 to the rear end of the support block 14, and also effective to make it hard to cause a short circuit at the end of the terminal 28.

As shown in FIG. 11, the first wiring pattern 50 has a three-layer structure. Specifically, as the wiring board 110C of the third embodiment described above, the first wiring pattern 50 comprises a first layer 140, a second layer 142, and a third layer 144.

The first layer 140 is disposed directly on the ceramic substrate 16, and is made of the cermet of the substrate material and the electrode material. The second layer 142 is disposed on the first layer 140, and is made of the electrode material. The third layer 144 is disposed on the second layer 142, and is made of the cermet of the piezoelectric/electrostrictive material and the electrode material.

With respect to the electrode 26, the fifth wiring pattern 26c as the uppermost layer is made of a resinate of the electrode material. The intermediate patterns of the electrodes 24, 26, i.e., the second through fourth wiring patterns 24B, 26B, 24C, are made of the cermet of the electrode material and the piezoelectric/electrostrictive material. Since the second through fourth wiring patterns 24B, 26B, 24C need to function as electrically conductive layers, the electrode material and the piezoelectric/electrostrictive material thereof should preferably be mixed at a ratio ranging from 4:6 to 9:1. If the proportion of the electrode material is smaller than 4, then the second through fourth wiring patterns 24B, 26B, 24C may be hard to function as electrically conductive layers. If the proportion of the electrode material is greater than 9, then the advantages obtained by making the electrodes thin and the bonding strength of the wiring patterns with respect to the piezoelectric/electrostrictive layers are reduced. When the above ratio conditions are satisfied, each of the intermediate patterns can be constructed as an electrically conductive pattern having a thickness of 2 $\mu$m or less, and can be shaped substantially as designed without undesirable local conductor-free areas.

The process of manufacturing the piezoelectric/electrostrictive device 10 will be described below with reference to FIGS. 12 through 19B. First, some definitions will be made with respect to the manufacturing process. The ceramic green laminated assembly 58 (see FIG. 13, for example) is defined as a laminated assembly of ceramic green sheets. A unitary laminated assembly produced when the ceramic green laminated assembly 58 is fired is defined as a laminated ceramic assembly 60 (see FIG. 14, for example). A unitary body produced when unnecessary portions are removed from the laminated ceramic assembly 60 and including the movable portions 20a, 20b, the thin plates 12a, 12b, and the support block 14 is defined as the ceramic substrate 16 (see FIG. 10).

In the manufacturing process according to the present invention, the laminated ceramic assembly 60 which contains portions corresponding to piezoelectric/electrostrictive devices 10 arranged in vertical and horizontal arrays is cut off into chips serving as piezoelectric/electrostrictive devices 10. In the present embodiment, it is assumed that only one piezoelectric/electrostrictive device 10 is fabricated.

A binder, a solvent, a dispersant, a plasticizer, etc., are added to a ceramic powder of zirconia or the like, and they are mixed into a slurry. After the slurry is deaerated, it is processed into a ceramic green sheet having a given thickness by a reverse roll coater process, a doctor blade process, or the like.

Figure 12:
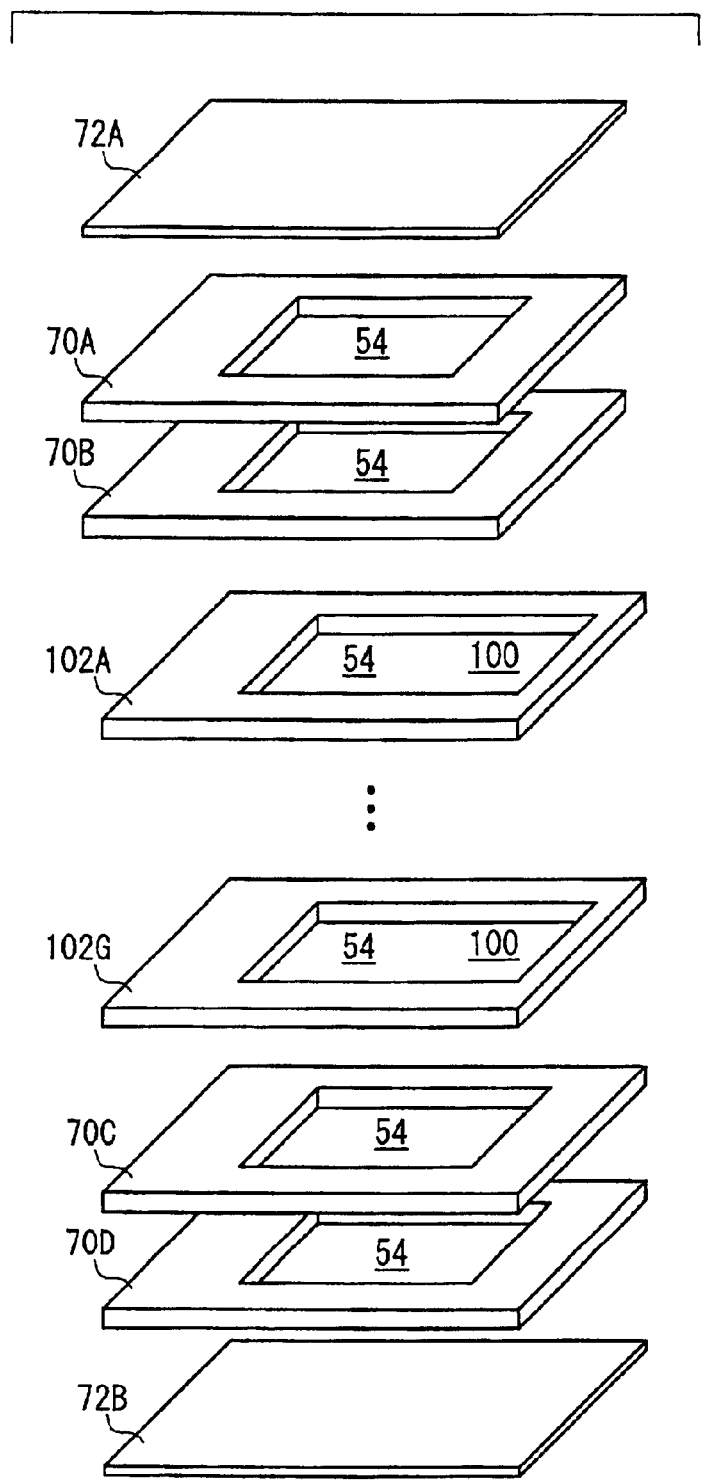
FIG. 12 is an exploded perspective view of ceramic green sheets to be laminated.

The ceramic green sheet is then shaped into a plurality of ceramic green sheets 70A through 70D, 72A, 72B, 102A through 102G as shown in FIG. 12, by a blanking process using dies, a laser beam cutting process, or the like. These ceramic green sheets will be processed into a ceramic substrate.

The ceramic green sheets 70A through 70D (four ceramic green sheets, for example) have windows 54 defined therein for forming a space between the thin plates 12a, 12b. The ceramic green sheets 102A through 102G (seven ceramic green sheets, for example) have continuous windows 54, 100 defined therein. The windows 54 serve as windows forming a space between the thin plates 12a, 12b, and the windows 100 serve as windows for forming the movable portions 20a, 20b having the end faces 34a, 34b which confront each other. The ceramic green sheets 72A, 72B (two ceramic green sheets, for example) will be the thin plates 12a, 12b, respectively. The above numbers of the various ceramic green sheets are given by way of example only.

Figure 13:
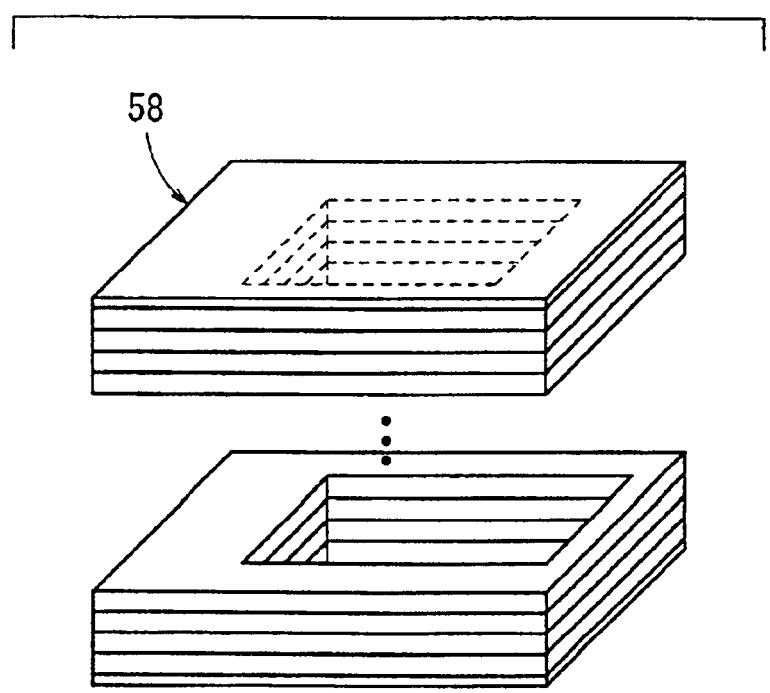
FIG. 13 is a perspective view of a laminated ceramic green assembly of the ceramic green sheets.

Thereafter, as shown in FIG. 13, the ceramic green sheets 70A through 70D, 72A, 72B, 102A through 102G are laminated and pressed into a ceramic green laminated assembly 58 in which the ceramic green sheets 70A through 70D, 102A through 102G are sandwiched between the ceramic green sheets 72A, 72B. The ceramic green sheets 102A through 102G are positioned centrally in the ceramic green laminated assembly 58.

Since the windows 100 produce regions where no pressure would be applied when the ceramic green sheets are pressed, the sequence in which the ceramic green sheets are laminated and pressed needs to be changed not to produce such regions. Thereafter, the ceramic green laminated assembly 58 is fired into the laminated ceramic assembly 60 (see FIG. 14).

As shown in FIG. 14, piezoelectric/electrostrictive elements 18a, 18b, each having a multilayer structure are formed respectively on the opposite surfaces of the laminated ceramic assembly 60, i.e., the surfaces where the ceramic green sheets 72A, 72B are then positioned. The assembly is then fired to integrally combine the piezoelectric/electrostrictive elements 18a, 18b with the laminated ceramic assembly 60. The piezoelectric/electrostrictive device 10 may be disposed on only one surface of the laminated ceramic assembly 60.

The process of forming the piezoelectric/electrostrictive element 18a on one surface of the laminated ceramic assembly 60 will be described in detail below with reference to FIGS. 15A through 19B. The process of forming the piezoelectric/electrostrictive element 18b is identical to the process of forming the piezoelectric/electrostrictive element 18a, and will not be described below.

Figure 15A:
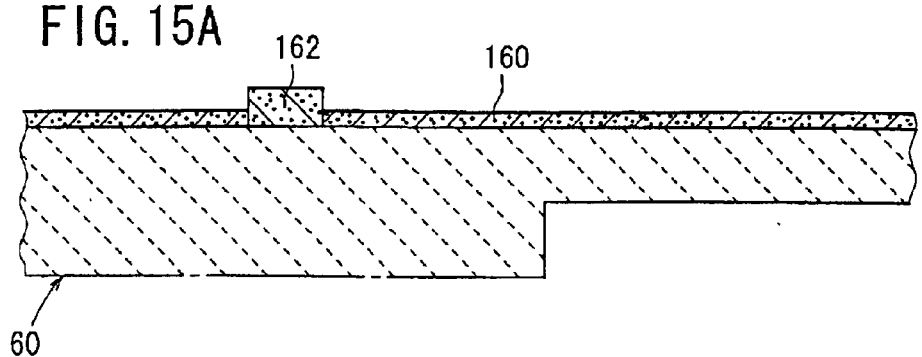
FIG. 15A is a fragmentary cross-sectional view showing a fabrication stage where a first cermet layer to be a first layer of a first wiring pattern and a second cermet layer to be an insulating pattern are formed in a process of manufacturing the piezoeiectric/electrostrictive device.

As shown in FIG. 15A, a first cermet layer 160 made of Pt/zirconia, for example, is formed on a surface of the laminated ceramic assembly 60 according to a screen printing process, for example. Thereafter, a second cermet layer 162 made of Pt/zirconia, for example, is formed in a region where the first cermet layer 160 is split (corresponding to the gap 40 shown in FIG. 11) according to a screen printing process, for example. The thicknesses of the first cermet layer 160 and the second cermet layer 162 are set such that the first cermet layer 160 and the second cermet layer 162 will have respective thicknesses of about 1 µm and about 5 µm after they are fired.

Figure 15B:
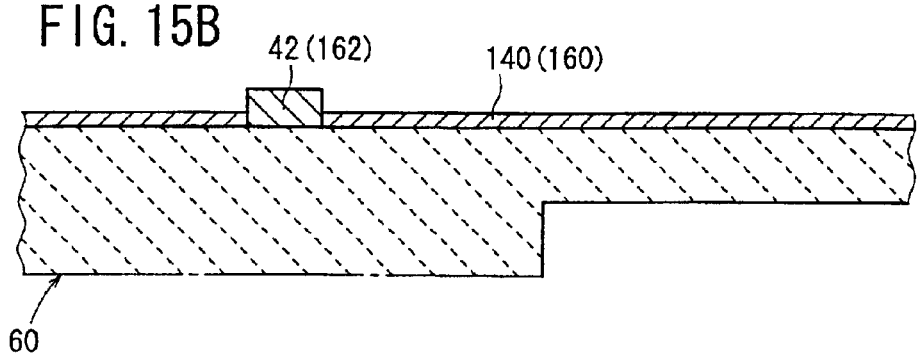
FIG. 15B is a fragmentary cross-sectional view showing a fabrication stage where the first wiring pattern and the insulating layer are simultaneously formed.

As shown in FIG. 15B, the assembly is then fired in a temperature range from 1000 to 1400° C. for 0.5 through 3 hours, thus converting the first cermet layer 160 into the first layer 140 (the first layer of the first wiring pattern 50) and the second cermet layer 162 into the insulating layer 42.

Figure 15C:
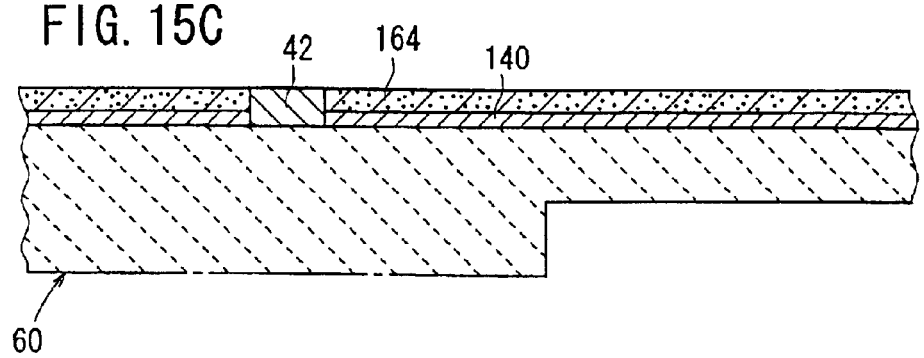
FIG. 15C is a fragmentary cross-sectional view showing a fabrication stage where a Pt paste to be a second layer of the first wiring pattern is formed.
Figure 16A:
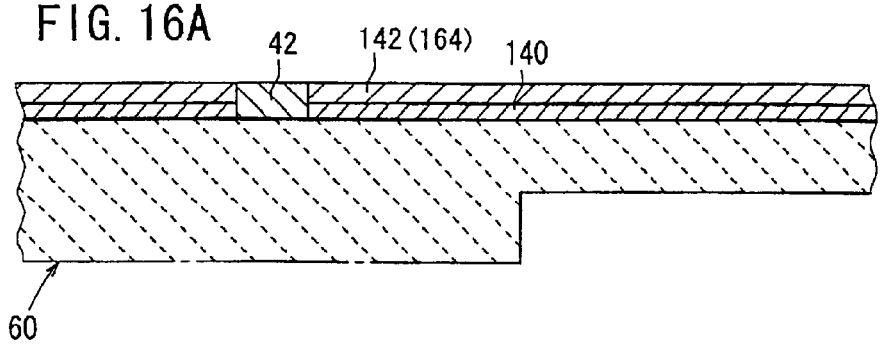
FIG. 16A is a fragmentary cross-sectional view showing a fabrication stage where the second layer is formed in the process of manufacturing the piezoelectric/electrostrictive device.

Next, as shown in FIG. 15C, a Pt paste 164 is formed on the first layer 140 according to a screen printing process, for example. The thickness of the Pt paste 164 is adjusted so that the thickness of the Pt paste ranges from 2 to 5 µm after the paste is fired. As shown in FIG. 16A, the assembly is then fired in a temperature range from 1000 to 1400° C. for 0.5 through 3 hours, thus converting the Pt paste 164 into the second layer 142 (the second layer of the first wiring pattern 50).

Figure 16B:
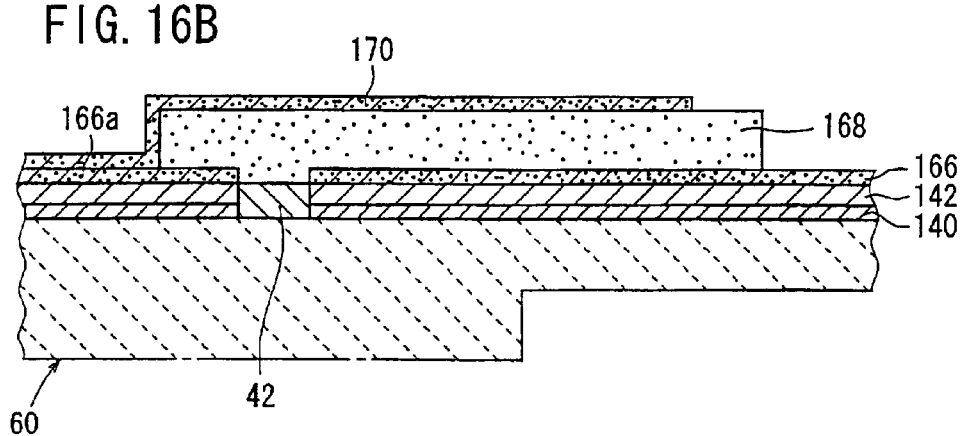
FIG. 16B is a fragmentary cross-sectional view showing a fabrication stage where a PZT paste to be a third layer in the first wiring pattern and a piezoelectric/electrostrictive layer of the first layer and a fourth cermet layer to be a second wiring pattern are formed.

As shown in FIG. 16B, a third cermet layer 166 made of Pt/PZT, for example, is then formed on the second layer 142 according to a screen printing process, for example. The thickness of the third cermet layer 166 is adjusted so that the third cermet layer 166 will have a thickness ranging from 0.5 to 3 µm after the layer is fired. A PZT paste 168 as the first layer is formed on the third cermet layer 166 and the exposed insulating layer 42 according to a screen printing process, for example. The thickness of the PZT paste 168 is adjusted so that the PZT paste 168 will have a thickness ranging from 5 to 25 µm after the paste is fired.

Thereafter, a fourth cermet layer 170 made of Pt/PZT, for example, to be the second wiring pattern 24B, is formed on the PZT paste 168 and a portion 166a (corresponding to the portion 24A of the first wiring pattern 50) of the exposed third cermet layer 166 according to a screen printing process, for example. The thickness of the fourth cermet layer 170 is adjusted so that the fourth cermet layer 170 will have a thickness ranging from 1 to 3 µm after the layer is fired.

Figure 16C:
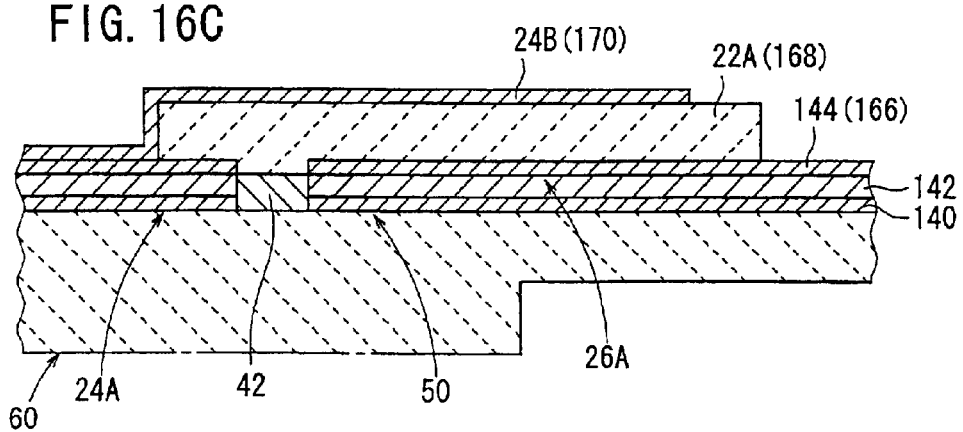
FIG. 16C is a fragmentary cross-sectional view showing a fabrication stage where the third layer, the piezoelectric/electrostrictive layer of the first layer, and the second wiring pattern are simultaneously formed.
Figure 17A:
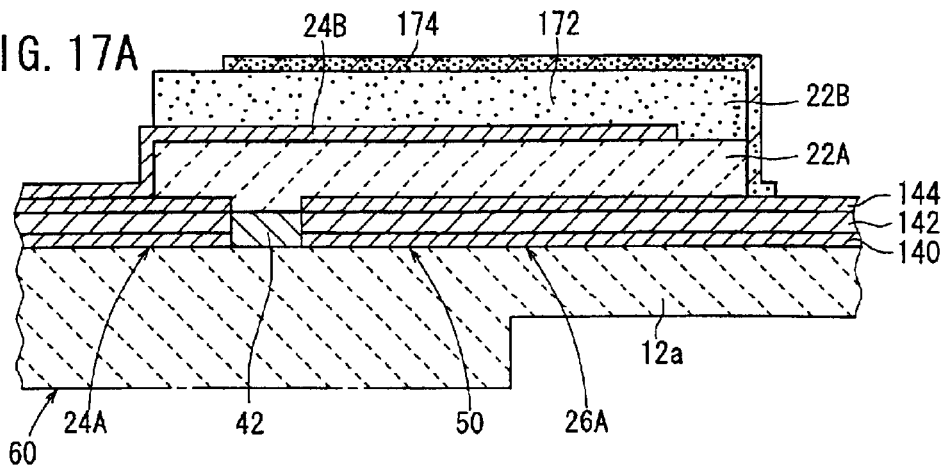
FIG. 17A is a fragmentary cross-sectional view showing a fabrication stage where a PZT paste to be a piezoelectric/electrostrictive layer of the second layer and a fifth cermet layer to be a third wiring pattern are formed in the process of manufacturing the piezoelectric/electrostrictive device.

As shown in FIG. 16C, the assembly is then fired in a temperature range from 1000 to 1400° C. for 0.5 through 3 hours, thus converting the third cermet layer 166 into the third layer 144 (the third layer of the first wiring pattern 50), the PZT paste 168 into the piezoelectric/electrostrictive layer 22A as the first layer, and the fourth cermet layer 170 into the second wiring pattern 24B. As shown in FIG. 17A, a PZT paste 172 as the second layer, for example, is then formed on the second wiring pattern 24B and the exposed piezoelectric/electrostrictive layer 22A as the first layer according to a screen printing process, for example. The thickness of the Pt paste 172 is adjusted so that the Pt paste 172 will have a thickness ranging from 5 to 25 µm after the paste is fired.

Next, a fifth cermet layer 174 made of Pt/PZT, for example, to be the third wiring pattern 26B, is formed on the PZT paste 172 and the other portion 26A of the first wiring pattern 50 according to a screen printing process, for example. The thickness of the fifth cermet layer 174 is adjusted so that the fifth cermet layer 174 will have a thickness ranging from 1 to 3 µm after the layer is fired.

Figure 17B:
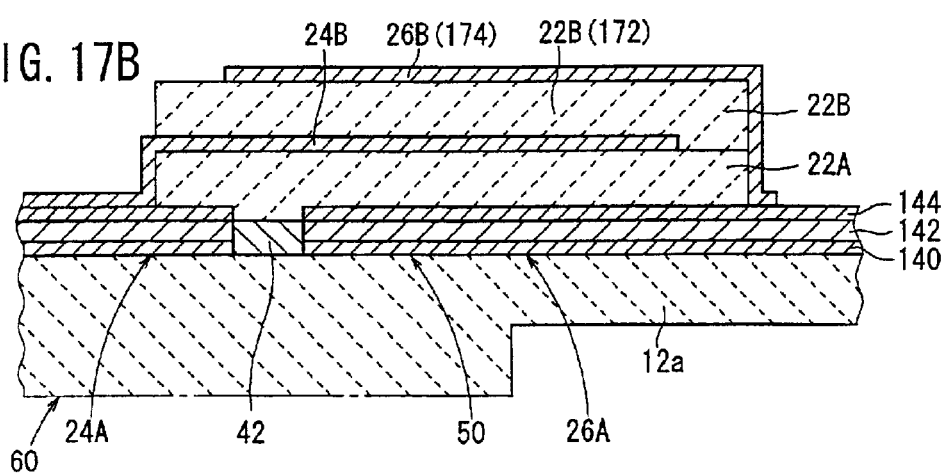
FIG. 17B is a fragmentary cross-sectional view showing a fabrication stage where the piezoelectric/electrostrictive layer of the second layer and the third wiring pattern are simultaneously formed.
Figure 17C:
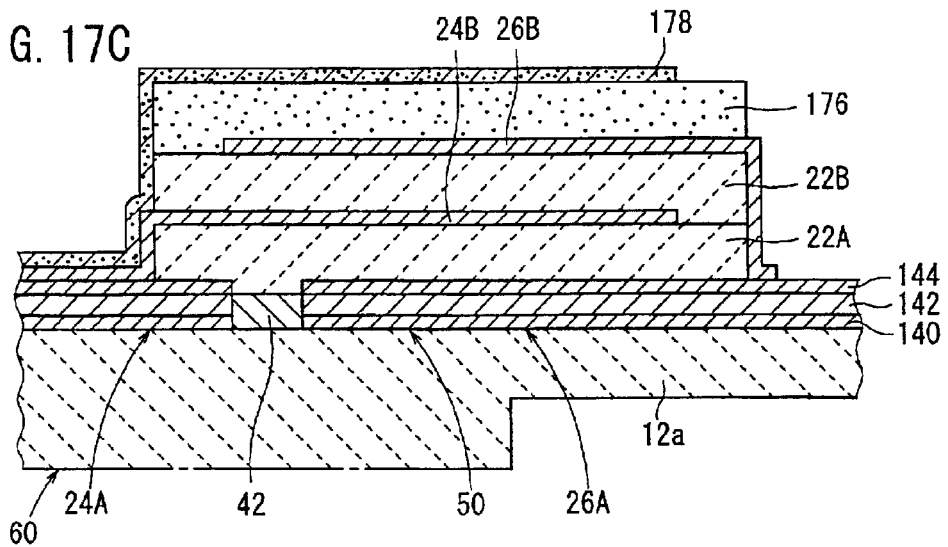
FIG. 17C is a fragmentary cross-sectional view showing a fabrication stage where a PZT paste to be a piezoelectric/electrostrictive layer of the third layer and a sixth cermet layer to be a fourth wiring pattern are formed.

As shown in FIG. 17B, the assembly is then fired in a temperature range from 1000 to 1400° C. for 0.5 through 3 hours, thus converting the PZT paste 172 into the piezoelectric/electrostrictive layer 22B as the second layer and the fifth cermet layer 174 into the third wiring pattern 26B. As shown in FIG. 17C, a PZT paste 176 as the third layer is then formed on the third wiring pattern 26B and the exposed piezoelectric/electrostrictive layer 22B as the second layer according to a screen printing process, for example. The thickness of the PZT paste 176 is adjusted so that the PZT paste 176 will have a thickness ranging from 5 to 25 µm after the paste is fired.

Next, a sixth cermet layer 178 made of Pt/PZT, for example, to be the fourth wiring pattern 24C, is formed on the PZT paste 176 and the exposed second wiring pattern 24B according to a screen printing process, for example. The thickness of the sixth cermet layer 178 is adjusted so that the sixth cermet layer 178 will have a thickness ranging from 1 to 3 µm after the layer is fired.

Figure 18A:
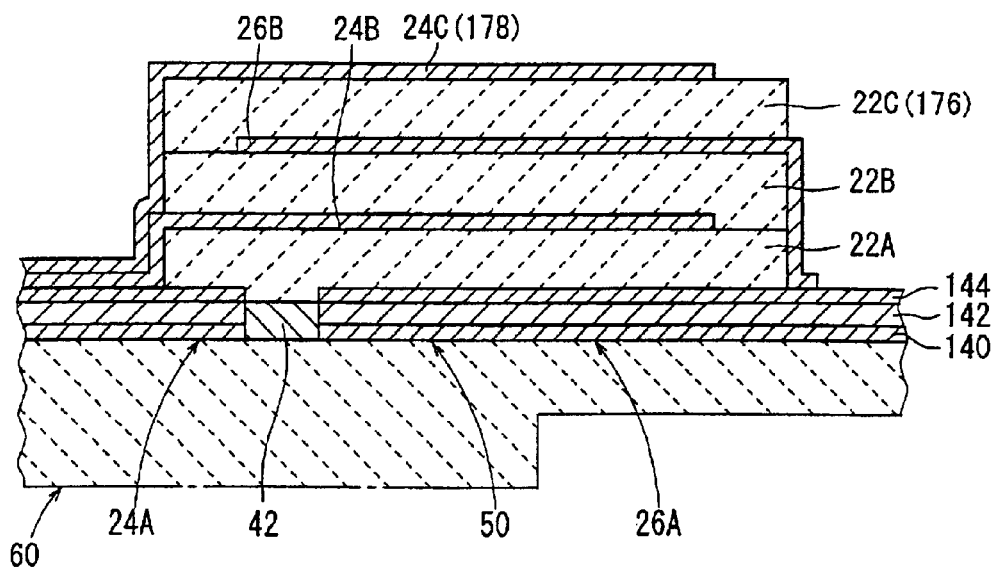
FIG. 18A is a fragmentary cross-sectional view showing a fabrication stage where the piezoelectric/electrostrictive layer of the third layer and the fourth wiring pattern are simultaneously formed in the process of manufacturing the piezoelectric/electrostrictive device.

As shown in FIG. 18A, the assembly is then fired in a temperature range from 1000 to 1400° C. for 0.5 through 3 hours, thus converting the PZT paste 176 into the piezoelectric/electrostrictive layer 22C as the third layer and the sixth cermet layer 178 into the fourth wiring pattern 24C.

Figure 18B:
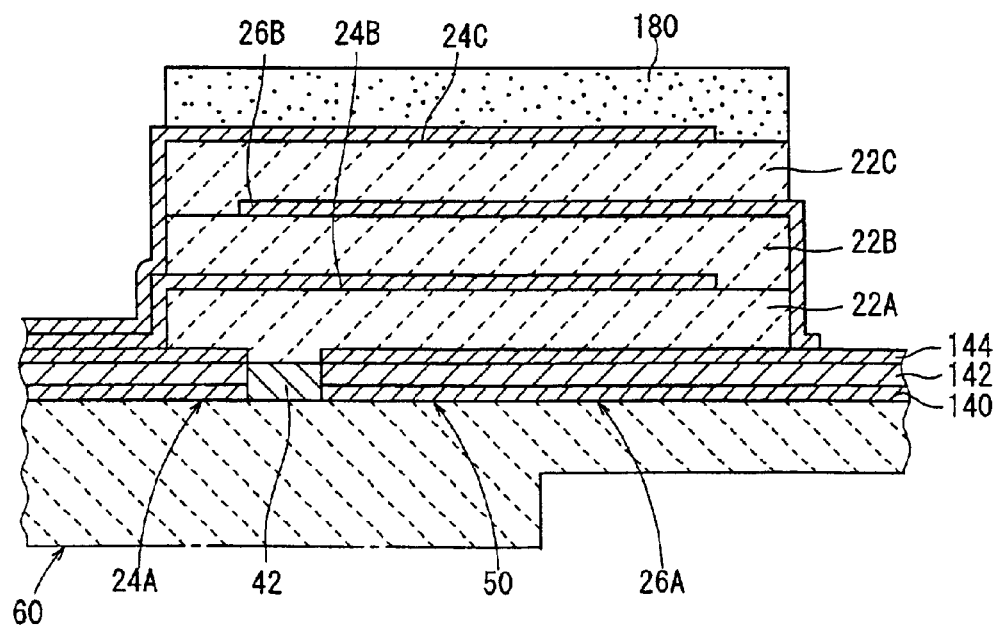
FIG. 18B is a fragmentary cross-sectional view showing a fabrication stage where a PZT paste to be a piezoelectric/electrostrictive layer of a fourth layer is formed.
Figure 19A:
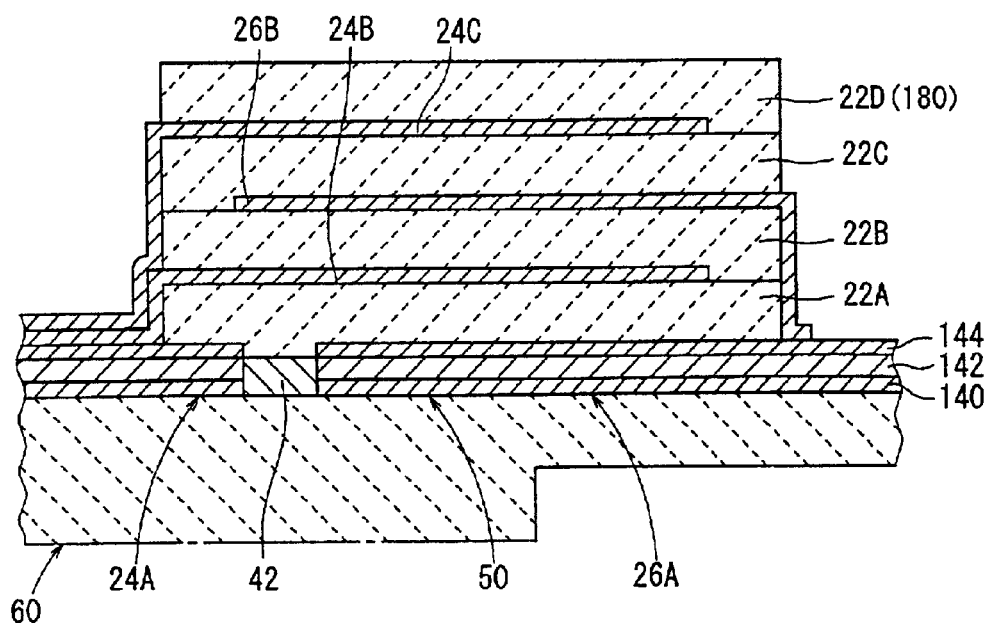
FIG. 19A is a fragmentary cross-sectional view showing a fabrication stage where the piezoelectric/electrostrictive layer of the fourth layer is formed in the process of manufacturing the piezoelectric/electrostrictive device.

As shown in FIG. 18B, a PZT paste 180 as the fourth layer is then formed on the fourth wiring pattern 24C and the exposed piezoelectric/electrostrictive layer 22C as the third layer according to a screen printing process, for example. The thickness of the PZT paste 180 is adjusted so that the PZT paste 180 will have a thickness ranging from 5 to 25 µm after the paste is fired. Then, as shown in FIG. 19A, the assembly is fired in a temperature range from 1000 to 1400° C. for 0.5 through 3 hours, thus converting the PZT paste 180 into the piezoelectric/electrostrictive layer 22D as the fourth layer.

Figure 19B:
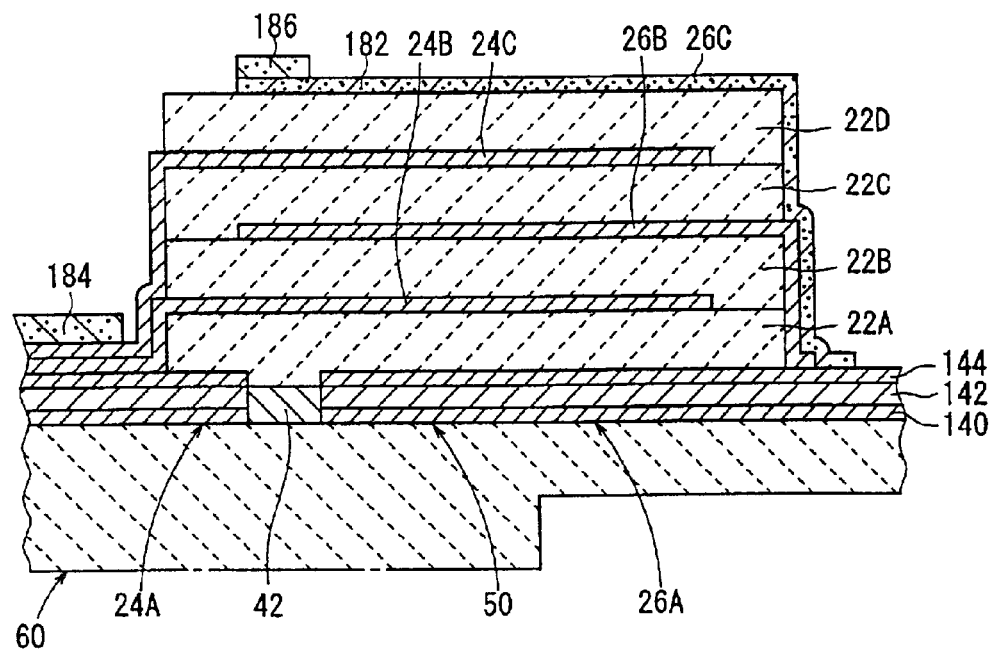
FIG. 19B is a fragmentary cross-sectional view showing a fabrication stage where a Pt resinate to be a fifth wiring pattern and an Au paste to be a terminal are formed.

Next, as shown in FIG. 19B, a Pt resinate 182, for example, to be the fifth wiring pattern 26C, is formed on the piezoelectric/electrostrictive layer 22D as the fourth layer, the exposed third wiring pattern 26B, and the other portion 26A of the first wiring pattern 50 according to a screen printing process, for example. The thickness of the Pt resinate 182 is adjusted so that the Pt resinate 182 will have a thickness ranging from 1 0.1 to 3 μm after the resinate is fired. An Au paste 184 and an Au paste 186, to be the terminal 28 and the terminal 30, respectively, are then formed on the portion 24A of the exposed wiring pattern 50 and the end of the Pt resinate 182 according to a screen printing process, for example.

Thereafter, the assembly is fired in a temperature range from 500 to 1000° C. for 0.5 through 3 hours, thus converting the Pt resinate 182 into the fifth wiring pattern 26C and the Au paste 184 and the Au paste 186 into the terminal 28 and the terminal 30, respectively. In this manner, as shown in FIG. 11, the multilayer piezoelectric/electrostrictive element 18a is formed on one surface of the laminated ceramic assembly 60. The multilayer piezoelectric/electrostrictive element 18b is also formed on the other surface of the laminated ceramic assembly 60 according to the same manufacturing process.

As shown in FIG. 14, the laminated ceramic assembly 60 with the piezoelectric/electrostrictive elements 18a, 18b disposed thereon is then cut along cutting lines C1, C2, C5, thus removing sides and a tip end of the laminated ceramic assembly 60. As a result, as shown in FIG. 10, the piezoelectric/electrostrictive device 10 is produced. The piezoelectric/electrostrictive device 10 has the piezoelectric/electrostrictive elements 18a, 18b on the ceramic substrate 16 and the movable portions 20a, 20b with the confronting end faces 34a, 34b, respectively.

The laminated ceramic assembly 60 may be severed first along the cutting lines C1, C2 and then along the cutting line C5, or first along the cutting line C5 and then along the cutting lines C1, C2. Alternatively, the laminated ceramic assembly 60 may be severed simultaneously along the cutting lines C1, C2, C5. The end face of the support block 14 may also be cut off.

Thereafter, the piezoelectric/electrostrictive device 10 is ultrasonically cleaned to remove debris which may have been produced in the cutting process. Since the piezoelectric/electrostrictive device 10 has the same structure as the wiring board 110C of the third embodiment, the first wiring pattern 50 is firmly bonded to the ceramic substrate 16 and the first piezoelectric/electrostrictive layer 22A. Further, the first piezoelectric/electrostrictive layer 22A does not have any portions floating over the gap 40 in the first wiring pattern 50 as the gap 40 is filled with the insulating layer 42. Therefore, the piezoelectric/electrostrictive layer 22A is reliably prevented from peeling off when the assembly is machined or cleaned.

As a result, when the laminated ceramic assembly 60 is cut off, it is not necessary to minimize the load applied to the assembly in the cutting process. The cutting process takes a reduced period of time and results in a low throughput. Also, when the laminated ceramic assembly 60 is cleaned, it is not necessary to minimize the load applied to the assembly in the cleaning process. The time required for the cleaning process efficiently reduced and thus requires a reduced man number of hours.

Various components of the piezoelectric/electrostrictive device 10 will be described below. As described above, the movable portions 20a, 20b operate based on actuating forces from the thin plates 12a, 12b, and various members are mounted on the movable portions 20a, 20b depending on the purpose of the piezoelectric/electrostrictive device 10.

For example, if the piezoelectric/electrostrictive device 10 is used as a displacement device, a shield plate of an optical shutter or the like is mounted on the movable portions 20a, 20b. If the piezoelectric/electrostrictive device 10 is used as a mechanism for positioning a magnetic head of a hard disk drive or a mechanism for suppressing the ringing of such a magnetic head, then the magnetic head, a slider having the magnetic head, or a suspension having a slider, or the like is mounted on the movable portions 20a, 20b for positioning.

The support block 14 supports the thin plates 12a, 12b and the movable portions 20a, 20b. If the piezoelectric/electrostrictive device 10 is used to position a magnetic head of a hard disk drive, for example, then the support block 14 is supported on and fixed to a carriage arm attached to a VCM (Voice Coil Motor) or a fixed plate or suspension attached to the carriage arm. Thus, the whole piezoelectric/electrostrictive device 10 is secured. As shown in FIG. 10, the terminals 28, 30 for energizing the piezoelectric/electrostrictive elements 18a, 18b may be mounted on the support block 14.

The movable portions 20a, 20b and the support block 14 are not limited to any materials insofar as the materials are rigid. Preferably, the movable portions 20a, 20b and the support block 14 are made of a ceramic material to which the above ceramic green sheet laminating process is applicable.

Specifically, it is preferable to use ceramics having a main component of zirconia (including stabilized zirconia and partially stabilized zirconia), alumina, magnesia, silicon nitride, aluminum nitride, titanium oxide, or mixtures of the above constituents. Ceramics having a main component of zirconia, especially stabilized zirconia, or partially stabilized zirconia are particularly preferable. These ceramics enhance mechanical strength and toughness.

The thin plates 12a, 12b are actuated when the piezoelectric/electrostrictive elements 18a, 18b are displaced. The thin plates 12a, 12b are flexible thin plates, and function to amplify an extended or contracted displacement of the piezoelectric/electrostrictive elements 18a, 18b disposed on their surfaces as a flexural displacement, and transmit the flexural displacement to the movable portions 20a, 20b. Therefore, the thin plates 12a, 12b may be made of a flexible material having a mechanical strength large enough for them not to be broken by a flexural displacement produced thereby. Materials of the thin plates 12a, 12b may be selected in view of the response and operability of the movable portions 20a, 20b.

The thin plates 12a, 12b should preferably be made of ceramics similar to those of the movable portions 20a, 20b and the support block 14. Particularly preferable are materials having zirconia, especially stabilized zirconia or partially stabilized zirconia as a main component, because they have large mechanical strength and toughness even if they are in the form of thin plates, and also because their reactivity with the piezoelectric/electrostrictive and electrode materials is small. Stabilized zirconia and partially stabilized zirconia should preferably be stabilized (and partially stabilized) by compounds such as yttrium oxide, ytterbium oxide, cerium oxide, calcium oxide, and magnesium oxide. Zirconia can be stabilized by adding one of these compounds to zirconia or adding a combination of these compounds to zirconia.

The above compounds may be added in an amount of 1 through 30 mol %, preferably 1.5 through 10 mol % for yttrium oxide or ytterbium oxide; 6 through 50 mol %, preferably 8 through 20 mol % for cerium oxide; or 5 through 40 mol %, preferably 5 through 20 mol % for calcium oxide or magnesium oxide. In particular, it is preferable to use yttrium oxide as a stabilizer. If yttrium oxide is used as a stabilizer, then it is preferable to add 1.5 through 10 mol %, more preferably 2 through 4 mol %, for yttrium oxide.

Alumina, silica, or a transition metal oxide may be added as an additive such as a sintering agent in a range from 0.05 to 20 wt %. If the piezoelectric/electrostrictive elements 18a, 18b are formed according to an integral sintering film forming process, then it is preferable to add alumina, magnesia, or a transition metal oxide.

In order to achieve the desired mechanical strength and stable crystalline phase, the average grain size of zirconia should preferably range from 0.05 to 3 µm, more preferably from 0.05 to 1 µm. While the thin plates 12a, 12b may be made of ceramics similar to those of the movable portions 20a, 20b and the support block 14, the thin plates 12a, 12b should preferably be made of a material substantially identical to that of the movable portions 20a, 20b and the support block 14 for thereby achieving the reliability of the joints and the mechanical strength of the piezoelectric/electrostrictive device 10, and simplifying manufacturing process.

The piezoelectric/electrostrictive elements 18a, 18b have at least the piezoelectric/electrostrictive layer 22 and the pair of electrodes 24, 26 for applying an electric field to the piezoelectric/electrostrictive layer 22, and may be in the form of unimorph or bimorph piezoelectric/electrostrictive elements. Especially, unimorph piezoelectric/electrostrictive elements combined with the thin plates 12a, 12b are better for excellent stability of produced displacements and a reduction in the weight of the piezoelectric/electrostrictive device 10. As shown in FIG. 10, the thin plates 12a, 12b can be displaced greatly when the piezoelectric/electrostrictive elements 18a, 18b are disposed on the sides of the thin plates 12a, 12b.

The piezoelectric/electrostrictive layer 22 is preferably made of piezoelectric ceramics. However, the piezoelectric/electrostrictive layer 22 may be made of electrostrictive ceramics, ferroelectric ceramics, or antiferroelectric ceramics. If the piezoelectric/electrostrictive device 10 is used to position a magnetic head of a hard disk drive, the piezoelectric/electrostrictive layer 22 is preferably made of a material having a small strain history, and preferably made of a material having a coercive electric field of 10 kV/mm or less since the linearity of the relationship between the displacement of the movable portions 20a, 20b and the drive voltage or output voltage is important.

Specific materials used for the piezoelectric/electrostrictive layer 22 are ceramics containing, singly or in combination, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate.

Particularly, materials having a main component of lead zirconate, lead titanate, lead magnesium niobate, or sodium bismuth titanate are preferably used because these materials have a high electromechanical coupling constant and a high piezoelectric constant, small reactivity with the thin plates (ceramics) 12a, 12b when the piezoelectric/electrostrictive layer 22 is fired, and provide a stable composition.

To these materials, there may be added, singly or in combination, lanthanum, calcium, strontium, molybdenum, tungsten, barium, niobium, zinc, nickel, manganese, cerium, cadmium, chromium, cobalt, antimony, iron, yttrium, tantalum, lithium, bismuth, stannum, etc. For example, if lanthanum or strontium is added to lead zirconate, lead titanate, and lead magnesium niobate which are main components, it is possible to adjust the coercive electric field and the piezoelectric properties. Materials which can easily be vitrified, however, such as silica, etc., should not be added because those materials tend to react with the piezoelectric/electrostrictive material, change its composition, and degrade its piezoelectric properties when the piezoelectric/electrostrictive layer 22 is heated.

The electrodes 24, 26 of the piezoelectric/electrostrictive elements 18a, 18b are preferably made of a metal which is solid at room temperature and highly electrically conductive. For example, the electrodes 24, 26 are made of a metal such as aluminum, titanium, chromium, iron, cobalt, nickel, copper, zinc, niobium, molybdenum, ruthenium, palladium, rhodium, silver, stannum, tantalum, tungsten, iridium, platinum, gold, lead, or the like, or an alloy of some of these metals. Alternatively, the electrodes 24, 26 may be made of a cermet containing one of the above metals or an alloy of some of these metals and the same material as the piezoelectric/electrostrictive layer 22 or the thin plates 12a, 12b dispersed in the metal or alloy.

The material of the electrodes 24, 26 is selected depending on the process for forming the piezoelectric/electrostrictive layer 22. For example, if the electrode 24 is formed on the thin plates 12a, 12b and thereafter the piezoelectric/electrostrictive layer 22 is formed on the electrode 24 by firing, then it is preferable to make the electrode 24 of a high-melting-point metal material such as platinum, palladium, a platinum-palladium alloy, a silver-palladium alloy, or the like which does not change by the temperature at which the piezoelectric/electrostrictive layer 22 is fired.

After the piezoelectric/electrostrictive layer 22 is formed, the electrode 26 as the outermost layer can be formed at a low temperature on the piezoelectric/electrostrictive layer 22. Therefore, the electrode 26 may be made of a low-melting-point such as aluminum, gold, silver, or the like. The thickness of the electrodes 24, 26 relates to the amount of displacement in the piezoelectric/electrostrictive elements 18a, 18b. Therefore, an electrode formed after the piezoelectric/electrostrictive layer 22 is fired should preferably be made of an organometallic paste which can be turned into a dense and thin film after being fired, such as a gold resinate paste, a platinum resinate paste, a silver resinate paste, or the like.

The piezoelectric/electrostrictive device 10 of the embodiment according to the present invention can be used as various sensors including an ultrasonic sensor, an acceleration sensor, an angular velocity sensor, an impact sensor, a mass sensor, etc. The sensitivity of the sensor can easily be adjusted by changing the size of an object attached between the end faces 34a, 34b or the thin plates 12a, 12b.

In the process of manufacturing the piezoelectric/electrostrictive device 10, the piezoelectric/electrostrictive elements 18a, 18b may be formed on the surface of the laminated ceramic assembly by, other than the screen printing process described above, a thick film forming process (dipping, coating, or electrophoresis) or a thin film forming process (ion beam, sputtering, vacuum evaporation, ion plating, chemical vapor deposition (CVD), plating, etc.).

By forming the piezoelectric/electrostrictive elements 18a, 18b according to a thick film forming process or a thin film forming process, the piezoelectric/electrostrictive elements 18a, 18b and the thin plates 12a, 12b can be joined to each other without any adhesive. It is possible to enhance reliability and reproducibility, and to facilitate integration.

It is preferable to form piezoelectric/electrostrictive elements 18a, 18b according to a thick film forming process. If the piezoelectric/electrostrictive layer 22 is formed according to the thick film forming process, then it can be formed as a film using a paste, a slurry, or a suspension or emulsion which is mainly composed of particles or powder of piezoelectric ceramics having an average particle diameter ranging from 0.01 to 5 µm, preferably from 0.05 to 3 µm, and good piezoelectric/electrostrictive properties can be achieved by firing the film thus formed.

The electrophoresis process is advantageous in that it can form films at a high density with a high shape accuracy. The screen printing process is effective to simplify the manufacturing process since it allows films and patterns to be formed at the same time.

The laminated ceramic assembly may be severed by a mechanical process such as dicing, wire sawing, etc., or a laser beam machining process using YAG laser, excimer laser, or the like, or an electron beam machining process.

The piezoelectric/electrostrictive device according to the present invention can be used as active devices including various transducers, various actuators, frequency-related functional components (filters), transformers, and vibrators, resonators, oscillators, and discriminators for communications or power applications, and also as sensors including an ultrasonic sensor, an acceleration sensor, an angular velocity sensor, an impact sensor, a mass sensor, etc. Particularly, the piezoelectric/electrostrictive device can be used as various actuators for displacing, positioning, and angularly adjusting various precision components of optical and precision devices.

Although certain preferred embodiments of the present invention have been shown and described in detail, it should be understood that various changes and modifications may be made therein without departing from the scope of the appended claims.

What is claimed is:

1. A wiring board comprising:
    a ceramic substrate; and
    a wiring pattern disposed as an electrode layer on said ceramic substrate;
    said wiring pattern having gaps that are completely filled with an insulating layer made of a cermet.

2. A wiring board according to claim 1, wherein said insulating layer comprises a cermet layer containing a material of said electrode layer.

3. A wiring board according to claim 1, wherein said wiring pattern and said insulating layer have respective sides exposed outwardly.

4. A wiring board comprising:
    a ceramic substrate;
    a wiring pattern disposed as an electrode layer on said ceramic substrate; and
    a piezoelectric/electrostrictive layer disposed on said wiring pattern;
    said wiring pattern having gaps filled with an insulating layer made of a cermet.

5. A wiring board according to claim 4, wherein said insulating layer comprises a cermet layer containing a material of said piezoelectric/electrostrictive layer.

6. A wiring board according to claim 4, wherein said wiring pattern and said insulating layer have respective sides exposed outwardly.

7. A wiring board according to claim 4, wherein said ceramic substrate comprises a support block and a vibratable portion contiguous to said support block and thinner than said support block, wherein said wiring pattern extends from said vibratable portion to said support block, and wherein said insulating layer is disposed on said support block.

8. A wiring board comprising:
    a ceramic substrate;
    a wiring pattern disposed as an electrode layer on said ceramic substrate, said wiring pattern comprising a firs layer comprising a cermet containing a material of said ceramic substrate and an electrically conductive material, and a second layer comprising an electrically conductive material; and
    a piezoelectric/electrostrictive layer disposed on said wiring pattern.

9. A wiring board according to claim 8, wherein said electrically conductive material is a material of said electrode layer.

10. A wiring board according to claim 8, wherein said wiring pattern has gaps filled with an insulating layer made of a cermet.

11. A wiring board according to claim 10, wherein said insulating layer comprises a cermet layer containing a material of said electrode layer.

12. A wiring board according to claim 10, wherein said insulating layer comprises a cermet layer containing a material of said piezoelectric/electrostrictive layer.

13. A wiring board according to claim 8, wherein said wiring pattern further comprises a third layer comprising a cermet of a piezoelectric/electrostrictive material and an electrically conductive material.

14. A wiring board according to claim 8, wherein said wiring pattern bas gaps that are filled with an insulating layer made of a cermet, and wherein said wiring pattern and said insulating layer have respective sides exposed outwardly.

15. A wiring board according to claim 8, wherein said ceramic substrate comprises a support block and a vibratable portion contiguous to said support block and thinner than said support block, and wherein said wiring pattern extends from said vibratable portion to said support block.

16. A wiring board according to claim 8, wherein said wiring pattern has gaps that are filled with an insulating layer made of a cermet, wherein said ceramic substrate comprises a support block and a vibratable portion contiguous to said support block and thinner than said support block, wherein said wiring pattern extends from said vibratable portion to said support block, and wherein said insulating layer is disposed on said support block.

17. A wiring board comprising:
    a ceramic substrate;
    a wiring pattern disposed as an electrode layer on said ceramic substrate; and
    a piezoelectric/electrostrictive layer disposed on said wiring pattern;
    said wiring pattern having gaps that are completely filled with an insulating layer made of a cermet.

18. The wiring board according to claim 17, wherein said insulating layer comprises a cermet layer containing a material of said electrode layer.

19. The wiring board according to claim 17, wherein said wiring pattern and said insulating layer have respective sides exposed outwardly.

20. The wiring board according to claim 17, wherein said ceramic substrate comprises a support block and a vibratable portion contiguous to said support block and thinner than said support block, wherein said wiring pattern extends from said vibratable portion to said support block, and wherein said insulating layer is disposed on said support block.

21. A wiring board comprising:
- a ceramic substrate comprising a support block and a vibratable portion contiguous to said support block and thinner than said support block; and
- a wiring pattern disposed as an electrode layer on said ceramic substrate, said wiring pattern having gaps that are completely filled with an insulating layer made of a cermet;

wherein said wiring pattern extends from said vibratable portion to said support block, and said insulating layer is disposed on said support block.

22. The wiring board according to claim 21, wherein said insulating layer comprises a cermet layer containing a material of said electrode layer.

23. The wiring board according to claim 21, wherein said wiring pattern and said insulating layer have respective said exposed outwardly.

* * * * *

UNITED STATES PATENT AND TRADEMARK OFFICE
CERTIFICATE OF CORRECTION

PATENT NO. : 6,844,659 B2
DATED : January 18, 2005
INVENTOR(S) : Koji Ikeda and Kazuyoshi Shibata It is certified that error appears in the above-identified patent and that said Letters Patent is hereby corrected as shown below:

Column 22,
Line 10, please change "firs" to -- first --
Line 34, please change "bas" to -- has --

Column 24,
Line 8, please change second occurrence of "said" to -- sides --

Signed and Sealed this

Nineteenth Day of April, 2005

JON W. DUDAS
*Director of the United States Patent and Trademark Office*